United States Patent
Ould-Ahmed-Vall et al.

(10) Patent No.: US 9,575,757 B2
(45) Date of Patent: Feb. 21, 2017

(54) EFFICIENT ZERO-BASED DECOMPRESSION

(75) Inventors: Elmoustapha Ould-Ahmed-Vall, Chandler, AZ (US); Suleyman Sair, Chandler, AZ (US); Kshitij A. Doshi, Chandler, AZ (US); Charles R. Yount, Phoenix, AZ (US); Bret L. Toll, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 736 days.

(21) Appl. No.: 13/991,858

(22) PCT Filed: Dec. 30, 2011

(86) PCT No.: PCT/US2011/068226
§ 371 (c)(1),
(2), (4) Date: Jun. 5, 2013

(87) PCT Pub. No.: WO2013/101223
PCT Pub. Date: Jul. 4, 2013

(65) Prior Publication Data
US 2013/0339661 A1    Dec. 19, 2013

(51) Int. Cl.
*G06F 9/30* (2006.01)
*H03M 7/46* (2006.01)
(52) U.S. Cl.
CPC ....... *G06F 9/30036* (2013.01); *G06F 9/30018* (2013.01); *H03M 7/46* (2013.01)
(58) Field of Classification Search
CPC ...................................................... H04L 69/04
(Continued)

(56) References Cited

U.S. PATENT DOCUMENTS 5,764,167 A * 6/1998 Adams .................... H03M 7/46
                                                              341/63
6,657,561 B1   12/2003 Hanna
(Continued)

FOREIGN PATENT DOCUMENTS

TW            582167         4/2004

OTHER PUBLICATIONS

Dirk Koch & Jurgen Teich, "Platform-Independent Methodology for Partial Reconfiguration", ACM 2004, 6 pages.*
(Continued)

*Primary Examiner* — Andrew Caldwell
*Assistant Examiner* — Michael Metzger
(74) *Attorney, Agent, or Firm* — Nicholson De Vos Webster & Elliott LLP

(57) ABSTRACT

A processor core including a hardware decode unit to decode vector instructions for decompressing a run length encoded (RLE) set of source data elements and an execution unit to execute the decoded instructions. The execution unit generates a first mask by comparing set of source data elements with a set of zeros and then counts the trailing zeros in the mask. A second mask is made based on the count of trailing zeros. The execution unit then copies the set of source data elements to a buffer using the second mask and then reads the number of RLE zeros from the set of source data elements. The buffer is shifted and copied to a result and the set of source data elements is shifted to the right. If more valid data elements are in the set of source data elements this is repeated until all valid data is processed.

15 Claims, 17 Drawing Sheets

(58) Field of Classification Search
USPC .......................................................... 712/7
See application file for complete search history.

(56) References Cited

U.S. PATENT DOCUMENTS

| | | | |
|---|---|---|---|
| 6,757,820 B2 | 6/2004 | Sudharsanan et al. | |
| 7,598,648 B2 | 10/2009 | Fei | |
| 2003/0137437 A1* | 7/2003 | Watson | H03M 7/40 341/63 |
| 2008/0046698 A1* | 2/2008 | Ahuja | G06F 9/30167 712/224 |
| 2010/0223237 A1* | 9/2010 | Mishra | G06F 9/30156 707/693 |

OTHER PUBLICATIONS

Dirk Koch et al, "Bitstream Decompression for High Speed FPGA Configuration from Slow Memories", IEEE 2007, 8 pages.*

Xiaoke Qin et al, "Decoding-Aware Compression of FPGA Bitstreams", IEEE Mar. 2011, 9 pages.*
PCT International Search Report for PCT Counterpart Application No. PCT/US2011/068226, 3 pgs., (Sep. 24, 2012).
PCT Written Opinion of the International Searching Authority for PCT Counterpart Application No. PCT/US2011/068226, 4 pgs., (Sep. 24, 2012).
PCT Notification concerning Transmittal of International Preliminary Report on Patentability (Chapter I of the Patent Cooperation Treaty) for PCT Counterpart Application No. PCT/US2011/068226, 6 pgs., (Jul. 1, 2014).
Office action and Search Report with English translation of Search Report from Taiwan Patent Application No. 101148748, mailed Dec. 29, 2014, 16 pages.
Office action and Search Report from Chinese Patent Application No. 201180076334.1, mailed Dec. 28, 2015, 10 pages.
Notice of Allowance from Taiwan Patent Application No. 101148748, mailed Aug. 31, 2015, 2 pages.

* cited by examiner

Figure 3

| OP | ITERATION A | ITERATION B | ITERATION C |
|---|---|---|---|
| 200 | `0 6 2 0 9 3 0 4` ← SOURCE (SRC) 300<br>`0 0 0 0 0 0 0 0` ← RESULT (RES) 305<br>`0` ← INSERTION POINT (IP) 310 | `0 0 0 0 6 2 0 9` ← SRC 300<br>`0 0 0 0 0 0 0 4` ← RES 305<br>`4` ← IP 310 | `0 0 0 0 0 0 0 6` ← SRC 300<br>`0 0 0 0 9 0 0 4` ← RES 305<br>`7` ← IP 310 |
| 205 | `1 0 0 1 1 0 1 0` ← MASK M 315A | `1 1 1 1 0 1 1 0` ← MASK M 315B | `0 0 0 0 0 0 1 1` ← MASK M 315C |
| 210 | `1` ← TRAILING ZERO COUNT(K) 320A | `1` ← K 320B | `1` ← K 320C |
| 215 | `0 0 0 0 0 0 1 1` ← MASK P 325A | `0 0 0 0 0 0 0 1` ← MASK P 325B | `0 0 0 0 0 0 1 1` ← MASK P 325C |
| 220 | `0 0 0 0 0 0 0 4` ← TMP BUFFER 330A | `0 0 0 0 0 0 0 9` ← TMP BUFFER 330B | `0 0 0 0 0 0 0 6` ← TMP BUFFER 330C |
| 225 | `3` ← COUNT NUMBER (N) OF ZEROS 335A | `2` ← N 335B | `0` ← N 335C |
| 230 | `0 0 0 0 0 0 0 4` ← TMP BUFFER 330A | `0 0 0 9 0 0 0 0` ← TMP BUFFER 330B | `6 0 0 0 0 0 0 0` ← TMP BUFFER 330C |
| 235 | `0 0 0 0 0 0 0 4` ← RES 305 | `0 0 0 9 0 0 0 4` ← RES 305 | `6 0 0 0 9 0 0 4` ← RES 305 |
| 240 | `4` ← IP 310 | `7` ← IP 310 | `8` ← IP 310 |
| 245 | `0 0 0 0 6 2 0 9` ← 300 | `0 0 0 0 0 0 0 6` ← SRC 300 | `0 0 0 0 0 0 0 0` ← SRC 300 |
| 250 | NEXT ITERATION | NEXT ITERATION | NO MORE ITERATIONS |
| 255 | | | `6 0 0 0 9 0 0 4` ← RES 305 |

Figure 3

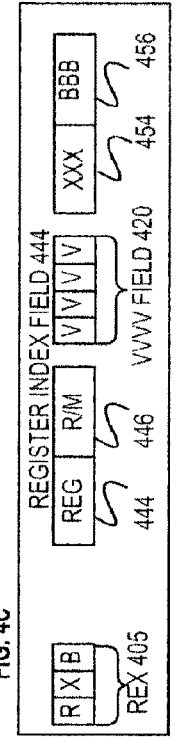
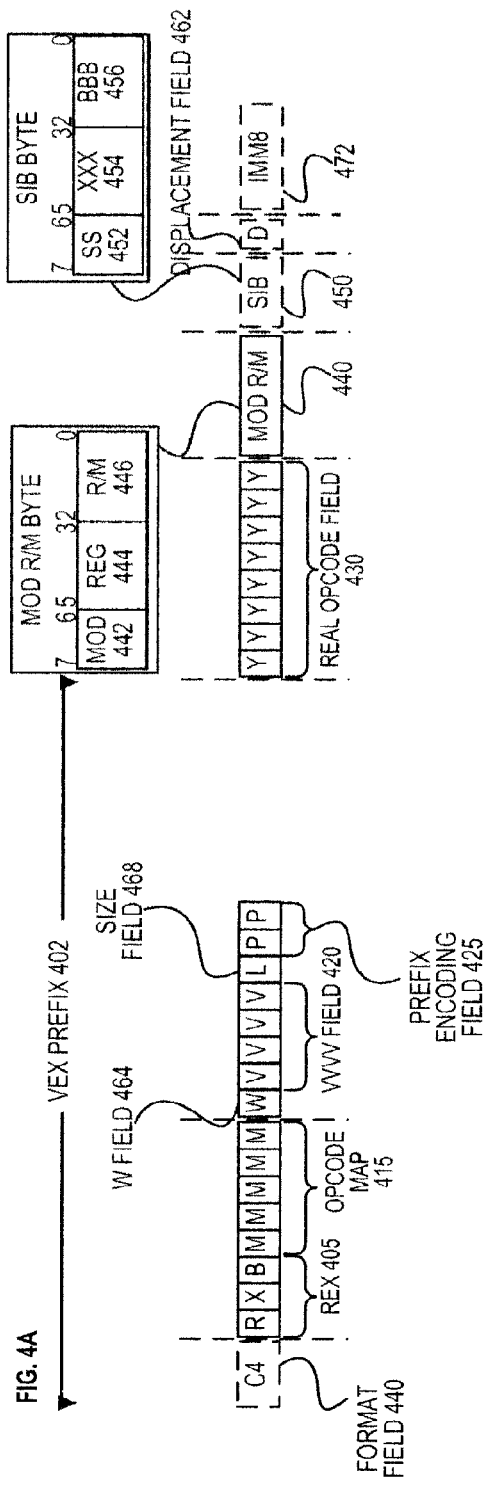
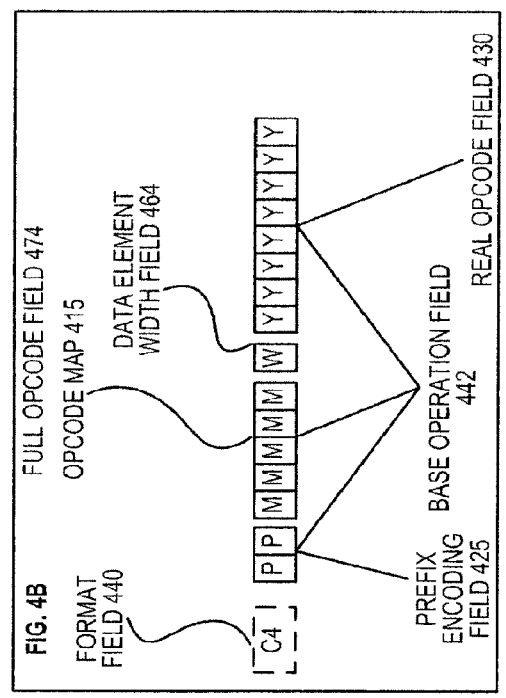

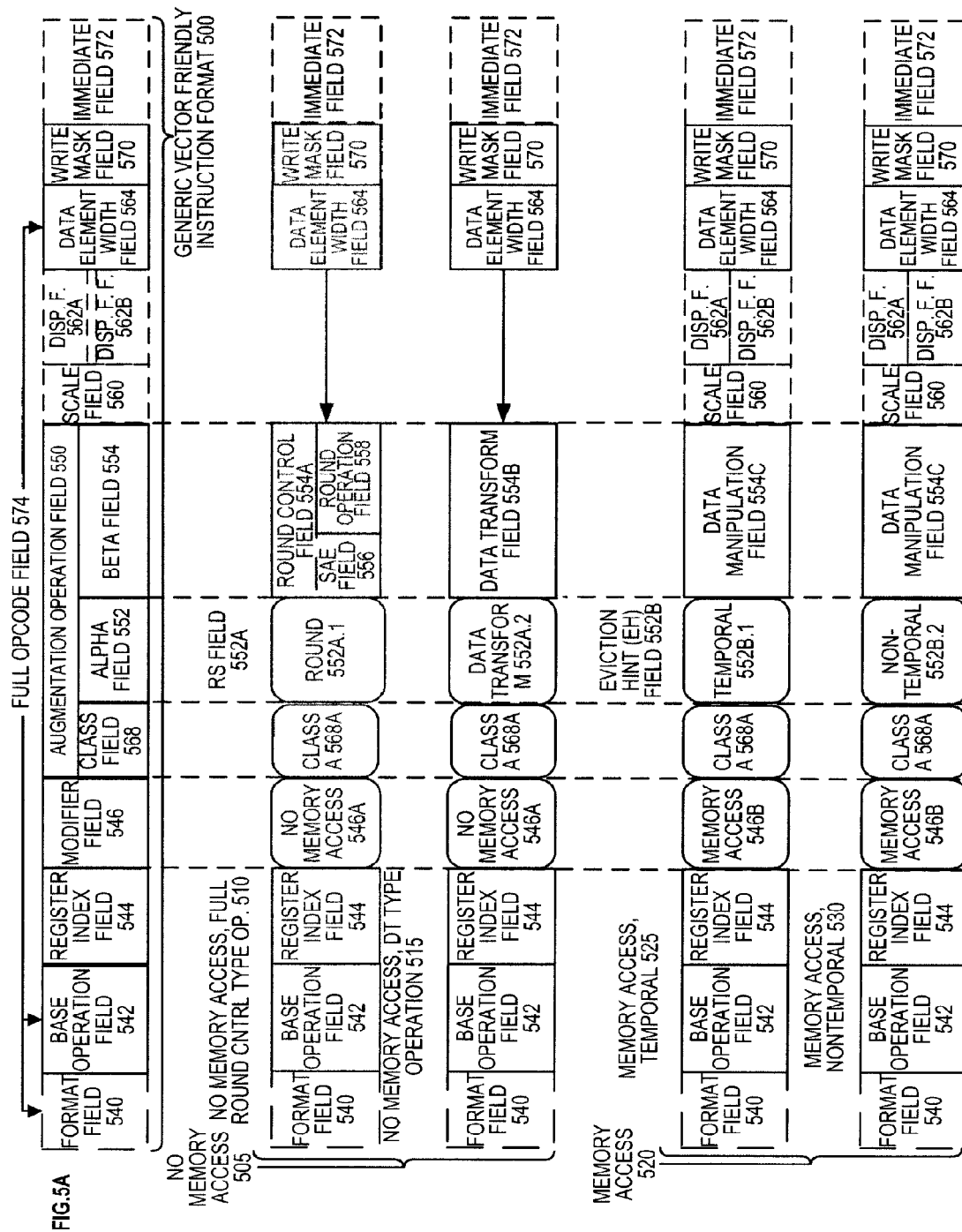

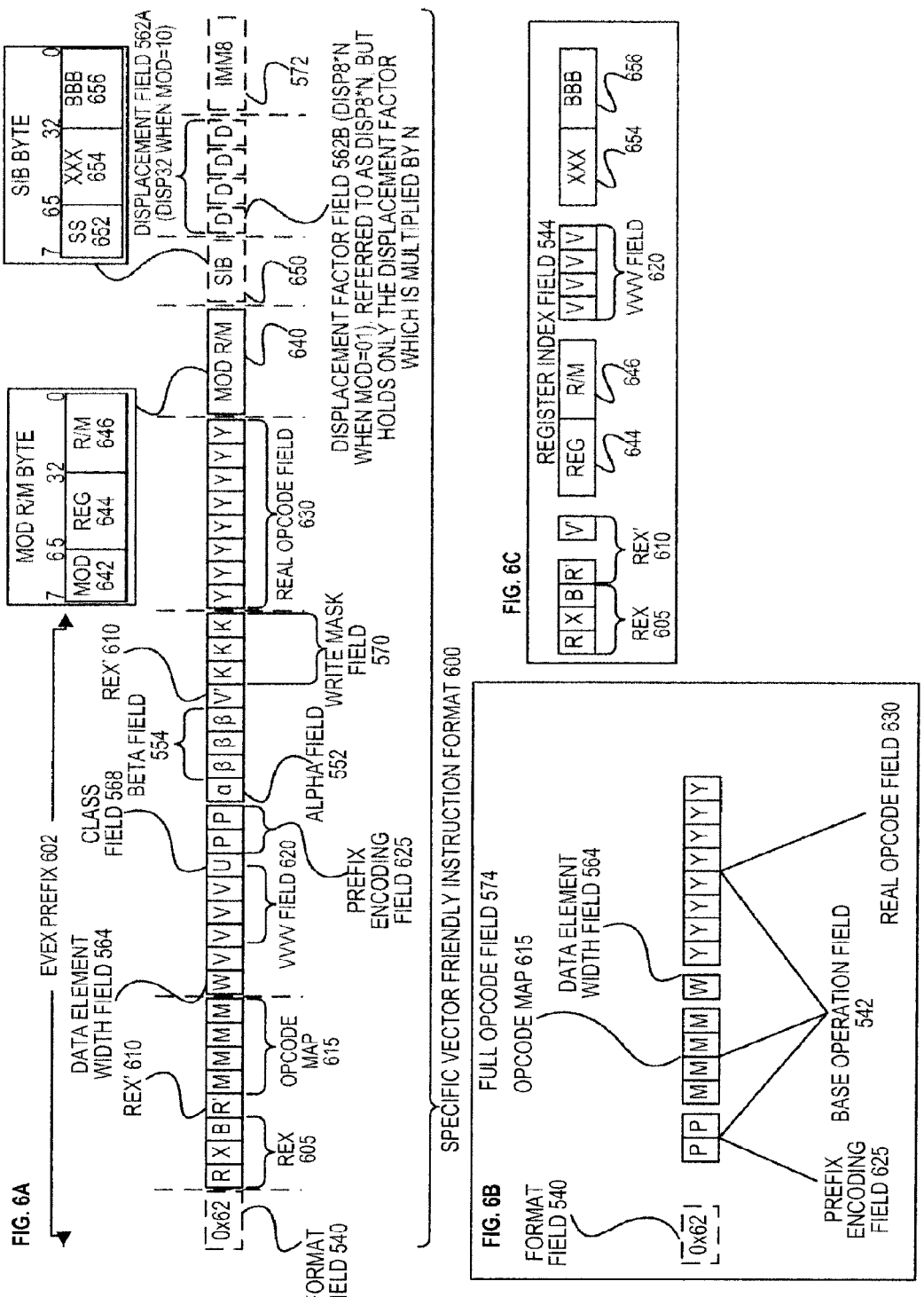

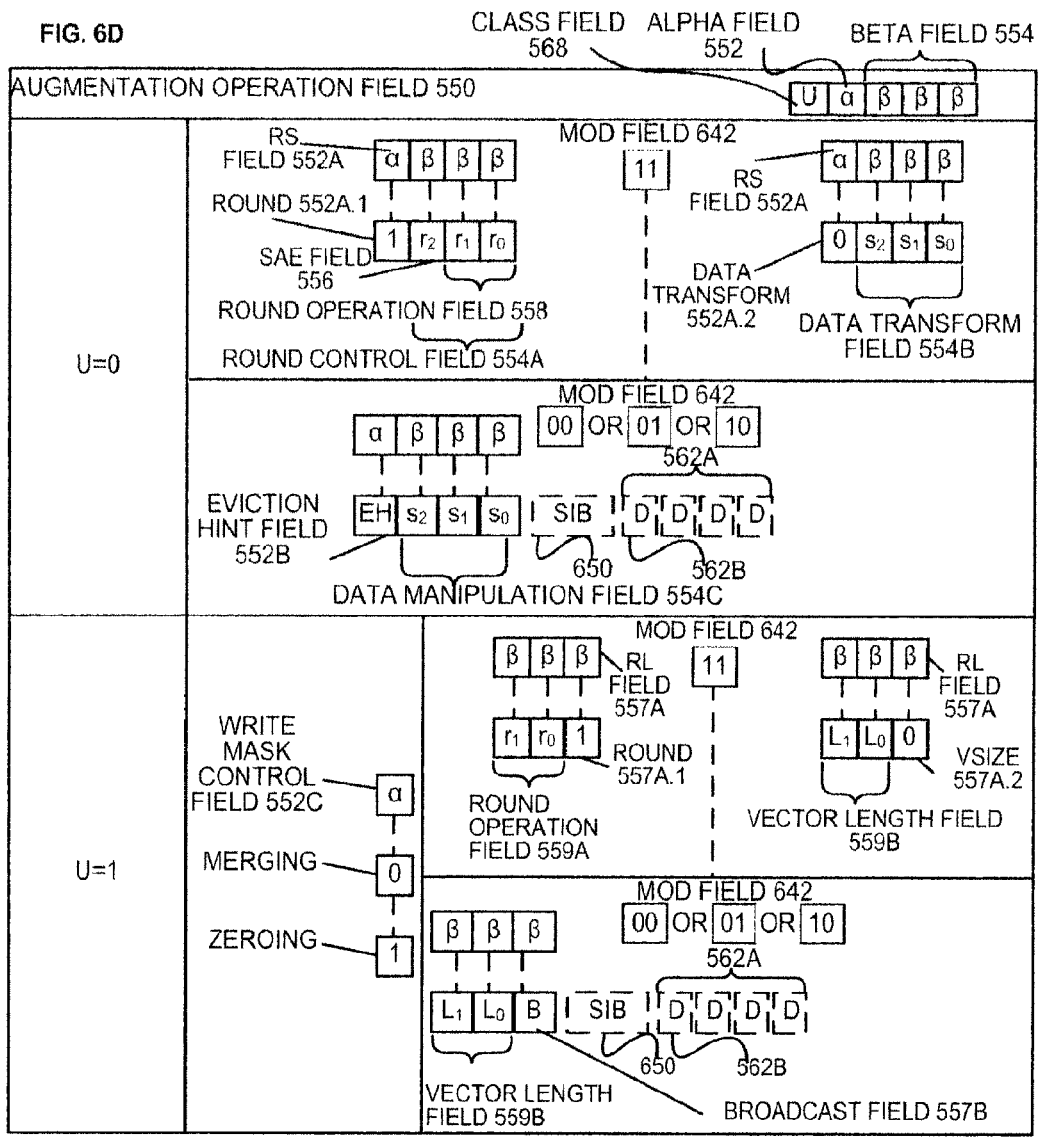

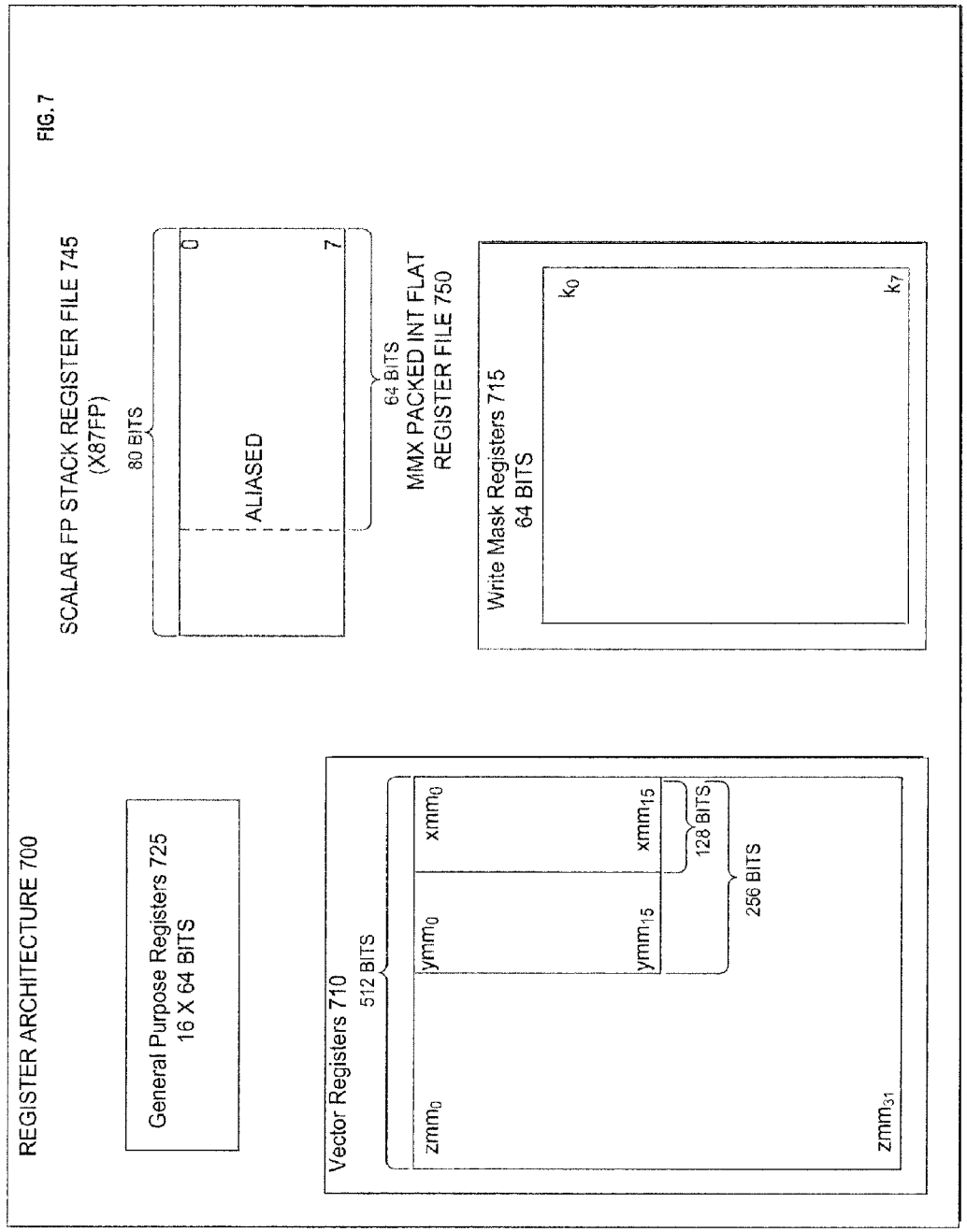

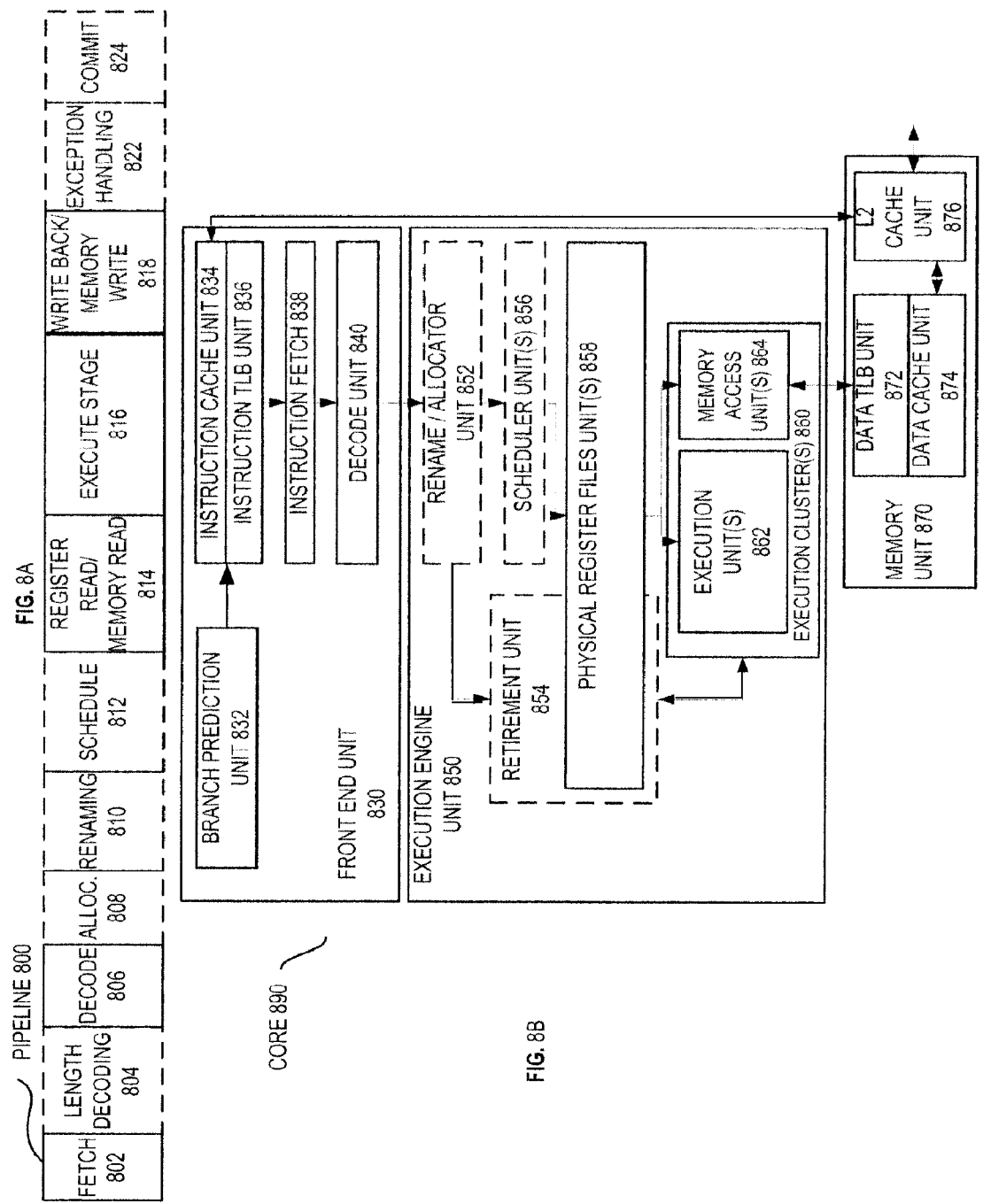

EFFICIENT ZERO-BASED DECOMPRESSION

CROSS-REFERENCE TO RELATED APPLICATIONS

This patent application is a U.S. National Phase Application under 35 U.S.C. §371 of International Application No. PCT/US2011/068226, filed Dec. 30, 2011, entitled EFFICIENT ZERO-BASED DECOMPRESSION.

FIELD

The field of invention relates generally to computer processor architecture, and, more specifically, to an efficient zero based decompression.

BACKGROUND

An instruction set, or instruction set architecture (ISA), is the part of the computer architecture related to programming, and may include the native data types, instructions, register architecture, addressing modes, memory architecture, interrupt and exception handling, and external input and output (I/O). It should be noted that the term instruction generally refers herein to a macro-instruction—that is instructions that are provided to the processor for execution—as opposed to micro-instructions or micro-ops—that result from a processor's decoder decoding macro-instructions). The instruction set architecture is distinguished from the microarchitecture, which is the internal design of the processor implementing the ISA. Processors with different microarchitectures can share a common instruction set.

An instruction set includes one or more instruction formats. A given instruction format defines various fields (number of bits, location of bits) to specify, among other things, the operation to be performed and the operand(s) on which that operation is to be performed. A given instruction is expressed using a given instruction format and specifies the operation and the operands. An instruction stream is a specific sequence of instructions, where each instruction in the sequence is an occurrence of an instruction in an instruction format.

Scientific, financial, auto-vectorized general purpose, RMS (recognition, mining, and synthesis)/visual and multimedia applications (e.g., 2D/3D graphics, image processing, video compression/decompression, voice recognition algorithms and audio manipulation) often require the same operation to be performed on a large number of data items (referred to as "data parallelism"). Single Instruction Multiple Data (SIMD) refers to a type of instruction that causes a processor to perform the same operation on multiple data items. SIMD technology is especially suited to processors that can logically divide the bits in a register into a number of fixed-sized data elements, each of which represents a separate value. For example, the bits in a 64-bit register may be specified as a source operand to be operated on as four separate 16-bit data elements, each of which represents a separate 16-bit value. As another example, the bits in a 256-bit register may be specified as a source operand to be operated on as four separate 64-bit packed data elements (quad-word (Q) size data elements), eight separate 32-bit packed data elements (double word (D) size data elements), sixteen separate 16-bit packed data elements (word (W) size data elements), or thirty-two separate 8-bit data elements (byte (B) size data elements). This type of data is referred to as the packed data type or vector data type, and operands of this data type are referred to as packed data operands or vector operands. In other words, a packed data item or vector refers to a sequence of packed data elements; and a packed data operand or a vector operand is a source or destination operand of a SIMD instruction (also known as a packed data instruction or a vector instruction).

By way of example, one type of SIMD instruction specifies a single vector operation to be performed on two source vector operands in a vertical fashion to generate a destination vector operand (also referred to as a result vector operand) of the same size, with the same number of data elements, and in the same data element order. The data elements in the source vector operands are referred to as source data elements, while the data elements in the destination vector operand are referred to a destination or result data elements. These source vector operands are of the same size and contain data elements of the same width, and thus they contain the same number of data elements. The source data elements in the same bit positions in the two source vector operands form pairs of data elements (also referred to as corresponding data elements; that is, the data element in data element position 0 of each source operand correspond, the data element in data element position 1 of each source operand correspond, and so on). The operation specified by that SIMD instruction is performed separately on each of these pairs of source data elements to generate a matching number of result data elements, and thus each pair of source data elements has a corresponding result data element. Since the operation is vertical and since the result vector operand is the same size, has the same number of data elements, and the result data elements are stored in the same data element order as the source vector operands, the result data elements are in the same bit positions of the result vector operand as their corresponding pair of source data elements in the source vector operands. In addition to this exemplary type of SIMD instruction, there are a variety of other types of SIMD instructions (e.g., that have only one or has more than two source vector operands; that operate in a horizontal fashion; that generate a result vector operand that is of a different size, that have a different size of data elements, and/or that have a different data element order). It should be understood that the term destination vector operand (or destination operand) is defined as the direct result of performing the operation specified by an instruction, including the storage of that destination operand at a location (be it a register or at a memory address specified by that instruction) so that it may be accessed as a source operand by another instruction (by specification of that same location by the another instruction.

Certain instruction set architectures allow multiple vector and scalar operations to complete in parallel and update the instruction set architecture register set. These instruction set architectures can be leveraged to implement compression/decompression instructions and algorithms such as instructions based on run-length encoding (RLE).

RLE is a form of lossless data compressing where sequences of data in a stream of data are compressed when those sequences contain one or more sets of consecutive data values. Rather than storing each data element in the set of consecutive data values, a single element with the value is stored followed by an element with the count of consecutive elements. This form of compression is most useful on data that contains many such runs.

For example, zero-based compression/decompression takes advantage of frequently occurring zero elements in data streams. In some data types, particularly data associated with graphics processing, it is common to have a significant portion of data contain the value zero and, in turn, many runs of zeros. RLE based on zero is often referred to as zero-based compression. Although other RLE schemes may be based on value other than zero if compression would benefit from another RLE value being selected.

FIG. 1 illustrates a prior art method for decompressing a zero-based stream. FIG. 1 starts with setting variable, such as a variable named INDEX, to zero in operation 100. Flow moves from 100 to 110 where it is determined whether the stream still has valid input. If there is no more valid input in the source stream then the flow is done in 190. If there is valid input, then flow moves to operation 110 where a source element at the position indicated by the index is read into a variable, such as a temporary variable named TEMP; TEMP=SOURCE[INDEX]. Flow moves to operation 115 where the index is incremented, INDEX=INDEX+1, and then to operation 120 where it is determined whether TEMP is equal to 0; TEMP==INDEX. If TEMP is not equal to zero, then the operation moves to 122 where TEMP is output as being decompressed. If TEMP is equal to zero then the flow moves to operation 125 where the contents of the source stream at the position indicated by the index, which as previously incremented, are read into a variable named COUNT; COUNT=SOURCE[INDEX]. The COUNT variable now holds the run length for the decompression of 0. Flow moves from 125 to operation 127 where INDEX is incremented, INDEX=INDEX+1, then to operation 130 where a second index, e.g. INDEX2, is set to 0. From here flow moves to a small loop that checks whether INDEX2 s less than COUNT at operation 135, outputs TEMP at operation 140, increments INDEX2 as operation 145, and then repeats from 135 until INDEX2 is no longer less than COUNT, meaning that the number of zeros indicated by the run length have been output. Once the correct number of zeros has been output, flow moves back to operation 105 and continues until there is no more valid input. This form of decompression is highly iterative and involves a data element by data element evaluation of the input stream to output non-zero values and convert a zero value/count pair into an output stream.

BRIEF DESCRIPTION OF THE DRAWINGS

The invention may best be understood by referring to the following description and accompanying drawings that are used to illustrate embodiments of the invention. In the drawings:

FIG. 3 illustrates an exemplary operation of the method shown in FIG. 2 according to one sample input;

FIG. 4a illustrates an exemplary AVX instruction format including a VEX prefix, real opcode field, Mod R/M byte, SIB byte, displacement field, and IMM8 according to one embodiment;

FIG. 4B illustrates which fields from FIG. 4A make up a full opcode field and a base operation field according to one embodiment;

FIG. 4C illustrates which fields from FIG. 4A make up a register index field according to one embodiment;

FIG. 5A is a block diagram illustrating a generic vector friendly instruction format and class A instruction templates thereof according to embodiments of the invention;

FIG. 6A is a block diagram illustrating an exemplary specific vector friendly instruction format according to embodiments of the invention;

FIG. 6B is a block diagram illustrating the fields of the specific vector friendly instruction format of FIG. 6a that make up the full opcode field according to one embodiment of the invention;

FIG. 6C is a block diagram illustrating the fields of the specific vector friendly instruction format that make up the register index field according to one embodiment of the invention;

FIG. 6D is a block diagram illustrating the fields of the specific vector friendly instruction format that make up the augmentation operation field according to one embodiment of the invention;

FIG. 7 is a block diagram of a register architecture according to one embodiment of the invention;

FIG. 8A is a block diagram illustrating both an exemplary in-order pipeline and an exemplary register renaming, out-of-order issue/execution pipeline according to embodiments of the invention;

FIG. 8B is a block diagram illustrating both an exemplary embodiment of an in-order architecture core and an exemplary register renaming, out-of-order issue/execution architecture core to be included in a processor according to embodiments of the invention;

DESCRIPTION OF EMBODIMENTS

In the following description, numerous specific details are set forth. However, it is understood that embodiments of the invention may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
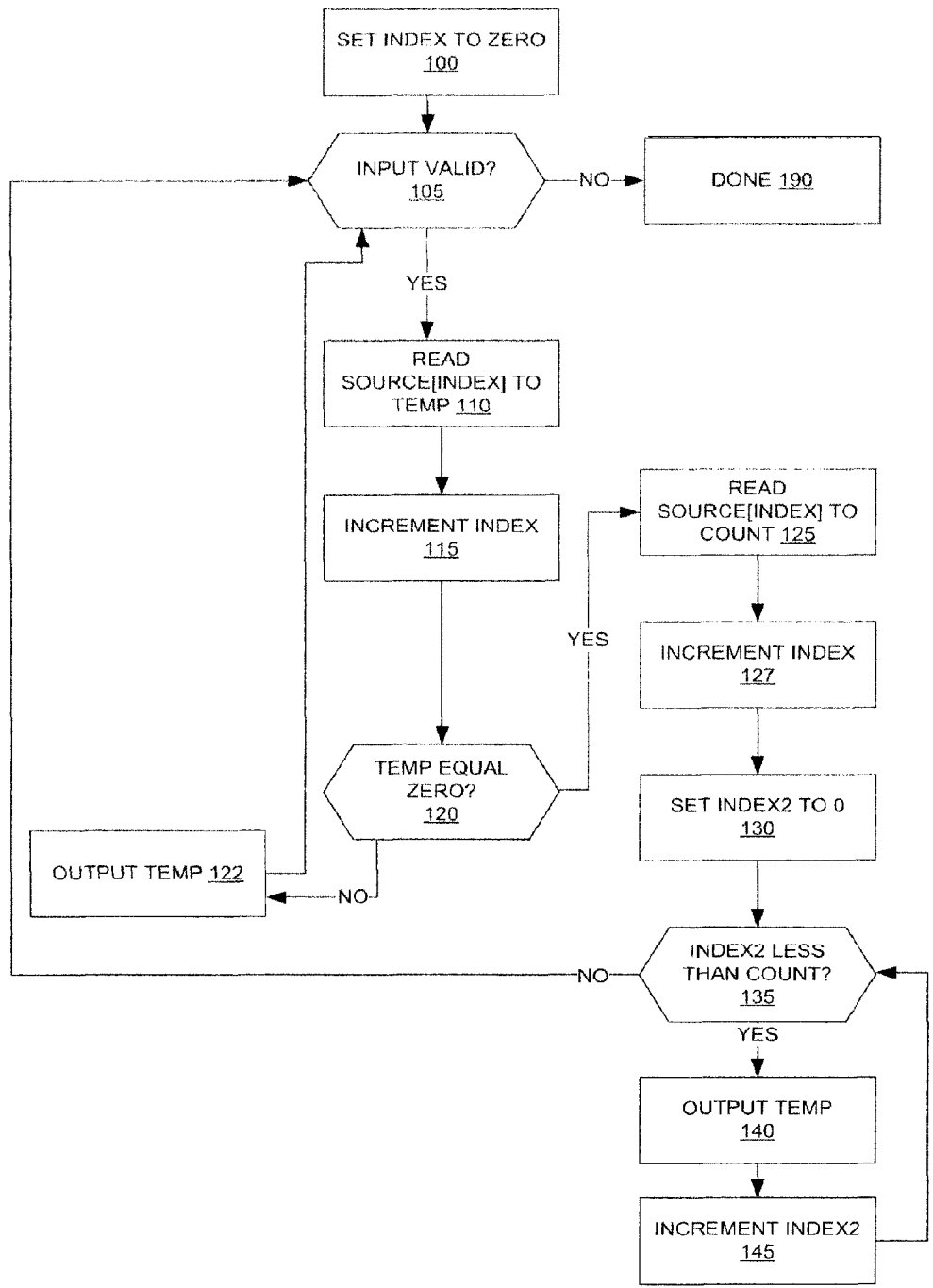
FIG. 1 illustrates a prior art method for decompressing a zero-based stream.

Rather than rely on an inefficient scalar implementation such as described in FIG. 1, embodiments of the invention make use of a vector based instruction set architecture. Thus, rather than use expensive shuffle and permute instructions, simple shifts and masked moves are utilized to more efficiently decompressed RLE data. Furthermore, while described with reference to zero-based RLE data, a different compression value, may be used for run length encoding and then used as the value that is decoded with a run length pair.

Figure 2:
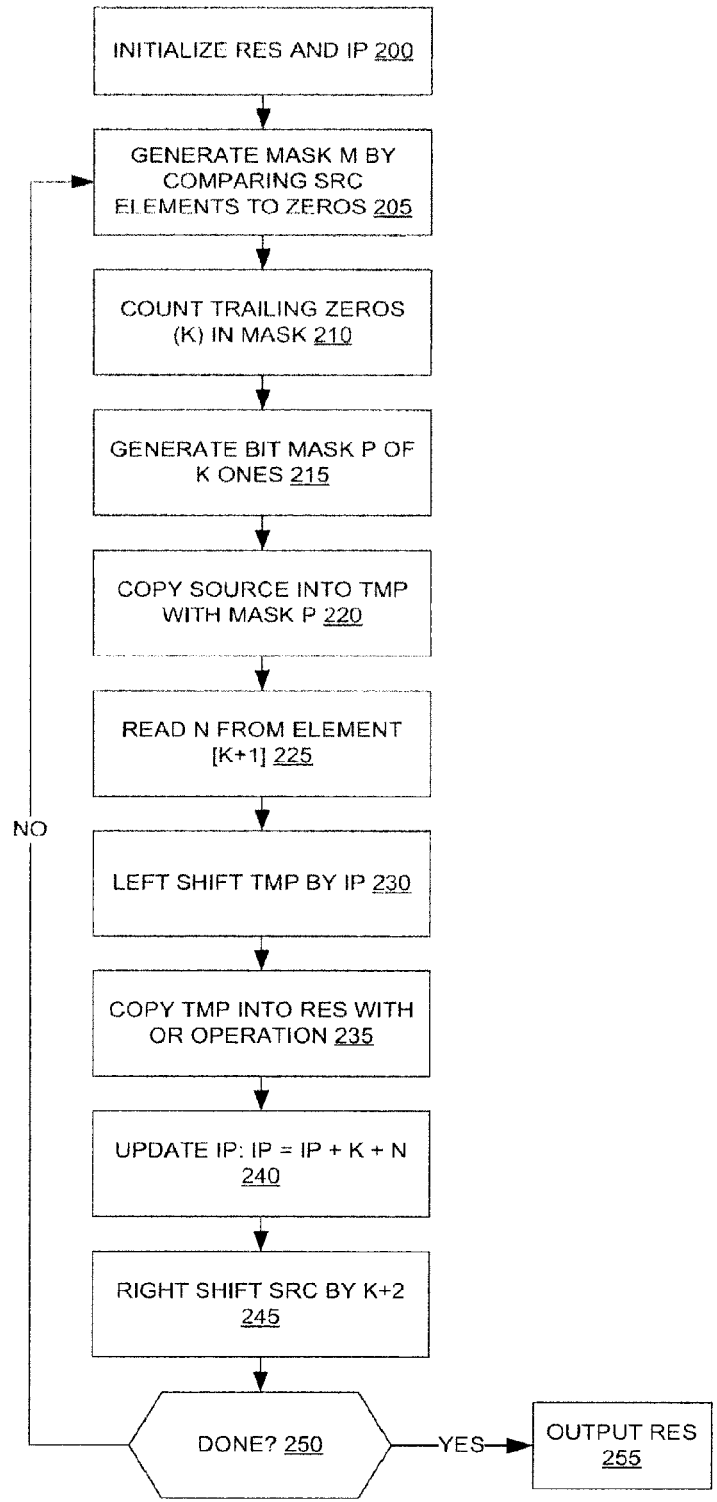
FIG. 2 illustrates an exemplary flow for run length decoding according to one embodiment.

FIG. 2 illustrates an exemplary flow for run length decoding according to one embodiment. Flow begins at operation 200 with initializing two variables to 0, a result variable named RES and an insertion point variable named IP. Flow moves to operation 205 with generating a mask named M by comparing the source SRC elements to a set of elements comprising the value that was RLE; e.g. comparing SRC to a set of 0s. Flow moves to operation 210 with counting the number of trailing zeros in the mask M and storing the value in a variable named K. From there flow moves to operation 215 with generation of a second mask named P that contains K 1s. The flow continues to operation 220 by performing a masked copy of source into a variable named TMP with the mask P. The flow then moves to operation 225 where the number of 0s is read from the element indexed by [K+1] in the source SRC. The variable TMP is left shifted based on IP at operation 230 to align TMP with the current position of the RES variable. At operation 235, TMP is copied into RES with an OR operation such that previously set values, from previous iterations, in RES are maintained while the newly copied values from the SRC that were put in TMP can be copied. From here, the flow continues at operation 240 where the insertion point IP is updated by adding K+N to the current IP. Next flow is moved to operation 245 where the source SRC if right shifted K+2 elements to remove previously processed values. Flow moves to operation 250 where it is determined whether the flow is done. If so, the flow moves to operation 255 with outputting the result RES. If not, the flows iterates back to operation 205.

In one embodiment of the invention, each operation is performed by a single instruction in an execution unit such as a vector execution unit. For example, certain vector instruction set architectures contain single instructions for generating a mask vector by comparing a source operand with a set of comparison values, such as a corresponding vector all set to 0. Still further, the same vector instruction set architectures may comprise an instruction for counting the number of consecutive zeros at the end of a source vector (i.e. the trailing zero count of a source vector register). While in other embodiments, one or more operations are performed by a single instruction for performing that operation. Still in further embodiments, each operation is performed by two or more instructions used in conjunction to perform said operation.

FIG. 3 illustrates an exemplary operation of the method shown in FIG. 2 according to one sample input. FIG. 3 is illustrated with four columns. The first column, most left hand column, is titled OP and each row is labeled with operations from FIG. 2 to indicate where in processing the rows correspond with. The following columns are titled iteration A, iteration B, and iteration C as the given input required 3 iterations. In the illustrated example, the source input SRC is shown as a stream of 8 data elements. However, it should be noted that the methods described are not limited to any particular number or width of data elements. For example, the operations described could work with 8 one-byte data elements or 16 32-bit data elements equally and would only be limited based on the architecture of the processor and/or memory used to execute said operations.

In FIG. 3, the source SRC 300 is set to 0, 6, 2, 0, 9, 3, 0, 4. This is a zero-based RLE value that will decode to 6, 0, 0, 9, 0, 0, 0, 4. At operation 200 in iteration A, the result RES 305 is set to 0, 0, 0, 0, 0, 0, 0, 0 and the insertion point IP 310 is set to 0. At operation 205 in iteration A, a mask M 315A is generated by comparing the SRC 300 to a set of 0s. This yields a mask M 315A as 1, 0, 0, 1, 0, 0, 1, 0 with a 1 in each position where the SRC 300 contained a 0. The number of trailing zeros, zeros at the far right of the mask M 315A, are counted at 210 and placed into a count K 320A as 1 trailing zero. At operation 215 of iteration A, a mask P 325A is generated with K 0s, such that mask P 325A contains 0, 0, 0, 0, 0, 0, 0, 1. At operation 220 a masked copy of the source SRC 300 is performed using mask P 325A to generate a TMP buffer 330A that contains 0, 0, 0, 0, 0, 0, 0, 4. Then in 225 of iteration A, the number of zeros N 335A is read from element K+1 of the source SRC 300, which is 3. In 230 of iteration A, the TMP buffer 330A is left shifted IP 310 times to align the TMP buffer 330A with the current position of the result RES 305. In 235 of iteration A, the TMP buffer 330A is copied into the result RES 305 using an OR operation to preserve previously set values in the result RES 305. At operation 240 of iteration A, the insertion point IP 310 is updated by adding K 320A and N 335A to IP 310; in iteration A, IP is set to 4 which is 0 (IP)+1 (K)+3 (N). In operation 245 the source if right shifted K 320A+2 times, in iteration A this is a right shift of 3, making source SRC 300 set to 0, 0, 0, 0, 6, 2, 0, 9. At 250 in iteration A, it is determined that more valid input exists and the next iteration should be ran.

Execution then continues back at operation 205 in iteration B. Now the SRC 300 is set to 0, 0, 0, 0, 6, 2, 0, 9. The result RES 305 is currently set to 0, 0, 0, 0, 0, 0, 0, 4 and the insertion point IP 310 is set to 4. At operation 205 in iteration B, a mask M 315B is generated by comparing the SRC 300 to a set of 0s. This yields a mask M 315B as 1, 1, 1, 1, 0, 0, 1, 0 with a 1 in each position where the SRC 300 contained a 0. The number of trailing zeros, zeros at the far right of the mask M 315B, are counted at 210 and placed into a count K 320B as 1 trailing zero. At operation 215 of iteration B, a mask P 325B is generated with K 0s, such that mask P 325B contains 0, 0, 0, 0, 0, 0, 0, 1. At operation 220 a masked copy of the source SRC 300 is performed using mask P 325B to generate a TMP buffer 330B that contains 0, 0, 0, 0, 0, 0, 0, 9. Then in 225 of iteration B, the number of zeros N 335B is read from element K+1 of the source SRC 300, which is 2. In 230 of iteration B, the TMP buffer 330B is left shifted IP 310 times to align the TMP buffer 330B with the current position of the result RES 305, this yields a TMP buffer of 0, 0, 0, 9, 0, 0, 0, 0. In 235 of iteration B, the TMP buffer 330B is copied into the result RES 305 using an OR operation to preserve previously set values in the result RES 305, yielding a result RES 300 of 0, 0, 0, 9, 0, 0, 0, 4 at iteration B. At operation 240 of iteration B, the insertion point IP 310 is updated by adding K 320B and N 335B to IP 310; in iteration B, IP is set to 7 which is 4 (IP)+1 (K)+2 (N). In operation 245 the source if right shifted K 320B+2 times, in iteration B this is a right shift of 3 yielding a source SRC 300 of 0, 0, 0, 0, 0, 0, 0, 6. At 250 in iteration B, it is determined that more valid input exists and the next iteration should be ran.

Execution then continues back at operation 205 in iteration C. Now the SRC 300 is set to 0, 0, 0, 0, 0, 0, 0, 6. The result RES 305 is currently set to 0, 0, 0, 9, 0, 0, 0, 4 and the insertion point IP 310 is set to 7. At operation 205 in iteration C, a mask M 315C is generated by comparing the SRC 300 to a set of 0s. This yields a mask M 315C as 1, 1, 1, 1, 1, 1, 1, 0 with a 1 in each position where the SRC 300 contained a 0. The number of trailing zeros, zeros at the far right of the mask M 315C, are counted at 210 and placed into a count K 320C as 1 trailing zero. At operation 215 of iteration C, a mask P 325C is generated with K 0s, such that mask P 325C contains 0, 0, 0, 0, 0, 0, 0, 1. At operation 220 a masked copy of the source SRC 300 is performed using mask P 325C to generate a TMP buffer 330C that contains 0, 0, 0, 0, 0, 0, 0, 6. Then in 225 of iteration C, the number of zeros N 335C is read from element K+1 of the source SRC 300, which is 0. In 230 of iteration C, the TMP buffer 330C is left shifted IP 310 times to align the TMP buffer 330C with the current position of the result RES 305, this yields a TMP buffer of 6, 0, 0, 0, 0, 0, 0, 0. In 235 of iteration C, the TMP buffer 330C is copied into the result RES 305 using an OR operation to preserve previously set values in the result RES 305, yielding a result RES 300 of 6, 0, 0, 9, 0, 0, 0, 4 at iteration C. At operation 240 of iteration C, the insertion point IP 310 is updated by adding K 320C and N 335C to IP 310; in iteration C, IP is set to 8 which is 7 (IP)+1 (K)+0 (N). In operation 245 the source if right shifted K 320C+2 times, in iteration C this is a right shift of 2 yielding a source SRC 300 of 0, 0, 0, 0, 0, 0, 0, 0. At 250 in iteration C, it is determined that no more valid input exists and that the result RES 305 of 6, 0, 0, 9, 0, 0, 0, 4 should be output in operation 255.

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

VEX Instruction Format

VEX encoding allows instructions to have more than two operands, and allows SIMD vector registers to be longer than 128 bits. The use of a VEX prefix provides for three-operand (or more) syntax. For example, previous two-operand instructions performed operations such as A=A+B, which overwrites a source operand. The use of a VEX prefix enables operands to perform nondestructive operations such as A=B+C.

FIG. 4A illustrates an exemplary AVX instruction format including a VEX prefix 402, real opcode field 430, Mod R/M byte 440, SIB byte 450, displacement field 462, and IMM8 472. FIG. 4B illustrates which fields from FIG. 4A make up a full opcode field 474 and a base operation field 442. FIG. 4C illustrates which fields from FIG. 4A make up a register index field 444.

VEX Prefix (Bytes 0-2) 402 is encoded in a three-byte form. The first byte is the Format Field 440 (VEX Byte 0, bits [7:0]), which contains an explicit C4 byte value (the unique value used for distinguishing the C4 instruction format). The second-third bytes (VEX Bytes 1-2) include a number of bit fields providing specific capability. Specifically, REX field 405 (VEX Byte 1, bits [7-5]) consists of a VEX.R bit field (VEX Byte 1, bit [7]—R), VEX.X bit field (VEX byte 1, bit [6]—X), and VEX.B bit field (VEX byte 1, bit[5]—B). Other fields of the instructions encode the lower three bits of the register indexes as is known in the art (rrr, xxx, and bbb), so that Rrrr, Xxxx, and Bbbb may be formed by adding VEX.R, VEX.X, and VEX.B. Opcode map field 415 (VEX byte 1, bits [4:0]—mmmmm) includes content to encode an implied leading opcode byte. W Field 464 (VEX byte 2, bit [7]—W)—is represented by the notation VEX.W, and provides different functions depending on the instruction. The role of VEX.vvvv 420 (VEX Byte 2, bits [6:3]-vvvv) may include the following: 1) VEX.vvvv encodes the first source register operand, specified in inverted (1s complement) form and is valid for instructions with 2 or more source operands; 2) VEX.vvvv encodes the destination register operand, specified in is complement form for certain vector shifts; or 3) VEX.vvvv does not encode any operand, the field is reserved and should contain 1111b. If VEX.L 468 Size field (VEX byte 2, bit [2]-L)=0, it indicates 128 bit vector; if VEX.L=1, it indicates 256 bit vector. Prefix encoding field 425 (VEX byte 2, bits [1:0]-pp) provides additional bits for the base operation field.

Real Opcode Field 430 (Byte 3) is also known as the opcode byte. Part of the opcode is specified in this field.

MOD R/M Field 440 (Byte 4) includes MOD field 442 (bits [7-6]), Reg field 444 (bits [5-3]), and R/M field 446 (bits [2-0]). The role of Reg field 444 may include the following: encoding either the destination register operand or a source register operand (the rrr of Rrrr), or be treated as an opcode extension and not used to encode any instruction operand. The role of R/M field 446 may include the following: encoding the instruction operand that references a memory address, or encoding either the destination register operand or a source register operand.

Scale, Index, Base (SIB)—The content of Scale field 450 (Byte 5) includes SS452 (bits [7-6]), which is used for memory address generation. The contents of SIB.xxx 454 (bits [5-3]) and SIB.bbb 456 (bits [2-0]) have been previously referred to with regard to the register indexes Xxxx and Bbbb.

The Displacement Field 462 and the immediate field (IMM8) 472 contain address data.

Exemplary Encoding into VEX

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 5B:
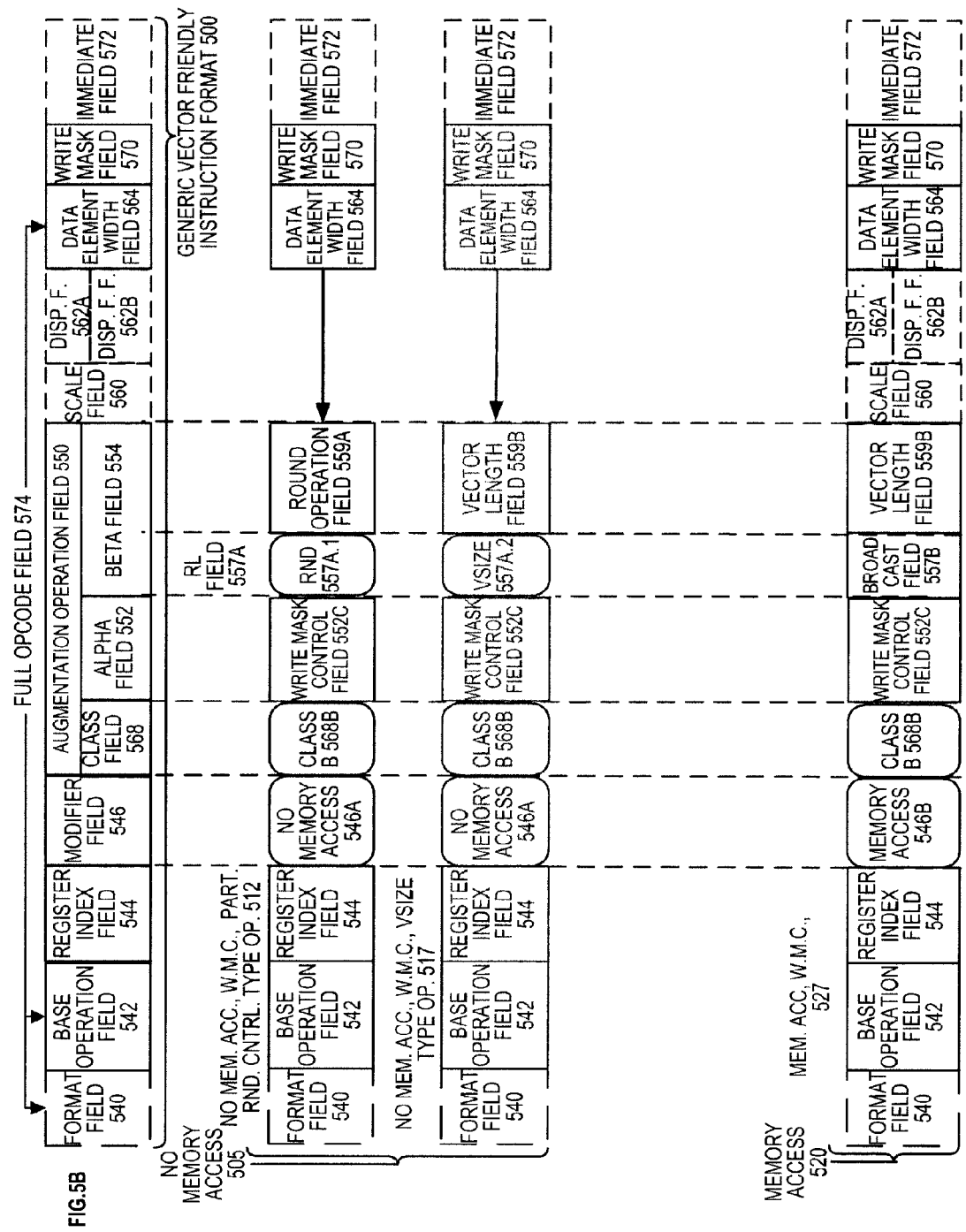
FIG. 5B is a block diagram illustrating the generic vector friendly instruction format and class B instruction templates thereof according to embodiments of the invention

FIGS. 5A-5B are block diagrams illustrating a generic vector friendly instruction format and instruction templates thereof according to embodiments of the invention. FIG. 5A is a block diagram illustrating a generic vector friendly instruction format and class A instruction templates thereof according to embodiments of the invention; while FIG. 5B is a block diagram illustrating the generic vector friendly instruction format and class B instruction templates thereof according to embodiments of the invention. Specifically, a generic vector friendly instruction format 500 for which are defined class A and class B instruction templates, both of which include no memory access 505 instruction templates and memory access 520 instruction templates. The term generic in the context of the vector friendly instruction format refers to the instruction format not being tied to any specific instruction set.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 5A include: 1) within the no memory access 505 instruction templates there is shown a no memory access, full round control type operation 510 instruction template and a no memory access, data transform type operation 515 instruction template; and 2) within the memory access 520 instruction templates there is shown a memory access, temporal 525 instruction template and a memory access, non-temporal 530 instruction template. The class B instruction templates in FIG. 5B include: 1) within the no memory access 505 instruction templates there is shown a no memory access, write mask control, partial round control type operation 512 instruction template and a no memory access, write mask control, vsize type operation 517 instruction template; and 2) within the memory access 520 instruction templates there is shown a memory access, write mask control 527 instruction template.

The generic vector friendly instruction format 500 includes the following fields listed below in the order illustrated in FIGS. 5A-5B.

Format field 540—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 542—its content distinguishes different base operations.

Register index field 544—its content, directly or through address generation, specifies the locations of the source and destination operands, be they in registers or in memory. These include a sufficient number of bits to select N registers from a PxQ (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 546—its content distinguishes occurrences of instructions in the generic vector instruction format that specify memory access from those that do not; that is, between no memory access 505 instruction templates and memory access 520 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 550—its content distinguishes which one of a variety of different operations to be performed in addition to the base operation. This field is context specific. In one embodiment of the invention, this field is divided into a class field 568, an alpha field 552, and a beta field 554. The augmentation operation field 550 allows common groups of operations to be performed in a single instruction rather than 2, 3, or 4 instructions.

Scale field 560—its content allows for the scaling of the index field's content for memory address generation (e.g., for address generation that uses $2^{scale}*index+base$).

Displacement Field 562A—its content is used as part of memory address generation (e.g., for address generation that uses $2^{scale}*index+base+displacement$).

Displacement Factor Field 562B (note that the juxtaposition of displacement field 562A directly over displacement factor field 562B indicates one or the other is used)—its content is used as part of address generation; it specifies a displacement factor that is to be scaled by the size of a memory access (N)—where N is the number of bytes in the memory access (e.g., for address generation that uses $2^{scale}*index+base+scaled\ displacement$). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 574 (described later herein) and the data manipulation field 554C. The displacement field 562A and the displacement factor field 562B are optional in the sense that they are not used for the no memory access 505 instruction templates and/or different embodiments may implement only one or none of the two.

Data element width field 564—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 570—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 570 allows for partial vector operations, including loads, stores, arithmetic, logical, etc. While embodiments of the invention are described in which the write mask field's 570 content selects one of a number of write mask registers that contains the write mask to be used (and thus the write mask field's 570 content indirectly identifies that masking to be performed), alternative embodiments instead or additional allow the mask write field's 570 content to directly specify the masking to be performed.

Immediate field 572—its content allows for the specification of an immediate. This field is optional in the sense that is it not present in an implementation of the generic vector friendly format that does not support immediate and it is not present in instructions that do not use an immediate.

Class field 568—its content distinguishes between different classes of instructions. With reference to FIGS. 5A-B, the contents of this field select between class A and class B instructions. In FIGS. 5A-B, rounded corner squares are used to indicate a specific value is present in a field (e.g., class A 568A and class B 568B for the class field 568 respectively in FIGS. 5A-B).

Instruction Templates of Class A

In the case of the non-memory access 505 instruction templates of class A, the alpha field 552 is interpreted as an RS field 552A, whose content distinguishes which one of the different augmentation operation types are to be performed (e.g., round 552A.1 and data transform 552A.2 are respectively specified for the no memory access, round type operation 510 and the no memory access, data transform type operation 515 instruction templates), while the beta field 554 distinguishes which of the operations of the specified type is to be performed. In the no memory access 505 instruction templates, the scale field 560, the displacement field 562A, and the displacement scale filed 562B are not present.

No-Memory Access Instruction Templates—Full Round Control Type Operation

In the no memory access full round control type operation 510 instruction template, the beta field 554 is interpreted as a round control field 554A, whose content(s) provide static rounding. While in the described embodiments of the invention the round control field 554A includes a suppress all floating point exceptions (SAE) field 556 and a round operation control field 558, alternative embodiments may support may encode both these concepts into the same field or only have one or the other of these concepts/fields (e.g., may have only the round operation control field 558).

SAE field 556—its content distinguishes whether or not to disable the exception event reporting; when the SAE field's 556 content indicates suppression is enabled, a given instruction does not report any kind of floating-point exception flag and does not raise any floating point exception handler.

Round operation control field 558—its content distinguishes which one of a group of rounding operations to perform (e.g., Round-up, Round-down, Round-towards-zero and Round-to-nearest). Thus, the round operation control field 558 allows for the changing of the rounding mode on a per instruction basis. In one embodiment of the invention where a processor includes a control register for specifying rounding modes, the round operation control field's 550 content overrides that register value.

No Memory Access Instruction Templates—Data Transform Type Operation

In the no memory access data transform type operation 515 instruction template, the beta field 554 is interpreted as a data transform field 554B, whose content distinguishes which one of a number of data transforms is to be performed (e.g., no data transform, swizzle, broadcast).

In the case of a memory access 520 instruction template of class A, the alpha field 552 is interpreted as an eviction hint field 552B, whose content distinguishes which one of the eviction hints is to be used (in FIG. 5A, temporal 552B.1 and non-temporal 552B.2 are respectively specified for the memory access, temporal 525 instruction template and the memory access, non-temporal 530 instruction template), while the beta field 554 is interpreted as a data manipulation field 554C, whose content distinguishes which one of a number of data manipulation operations (also known as primitives) is to be performed (e.g., no manipulation; broadcast; up conversion of a source; and down conversion of a destination). The memory access 520 instruction templates include the scale field 560, and optionally the displacement field 562A or the displacement scale field 562B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 552 is interpreted as a write mask control (Z) field 552C, whose content distinguishes whether the write masking controlled by the write mask field 570 should be a merging or a zeroing.

In the case of the non-memory access 505 instruction templates of class B, part of the beta field 554 is interpreted as an RL field 557A, whose content distinguishes which one of the different augmentation operation types are to be performed (e.g., round 557A.1 and vector length (VSIZE) 557A.2 are respectively specified for the no memory access, write mask control, partial round control type operation 512 instruction template and the no memory access, write mask control, VSIZE type operation 517 instruction template), while the rest of the beta field 554 distinguishes which of the operations of the specified type is to be performed. In the no memory access 505 instruction templates, the scale field 560, the displacement field 562A, and the displacement scale filed 562B are not present.

In the no memory access, write mask control, partial round control type operation 510 instruction template, the rest of the beta field 554 is interpreted as a round operation field 559A and exception event reporting is disabled (a given instruction does not report any kind of floating-point exception flag and does not raise any floating point exception handler).

Round operation control field 559A—just as round operation control field 558, its content distinguishes which one of a group of rounding operations to perform (e.g., Round-up, Round-down, Round-towards-zero and Round-to-nearest). Thus, the round operation control field 559A allows for the changing of the rounding mode on a per instruction basis. In one embodiment of the invention where a processor includes a control register for specifying rounding modes, the round operation control field's 550 content overrides that register value.

In the no memory access, write mask control, VSIZE type operation 517 instruction template, the rest of the beta field 554 is interpreted as a vector length field 559B, whose content distinguishes which one of a number of data vector lengths is to be performed on (e.g., 128, 256, or 512 byte).

In the case of a memory access 520 instruction template of class B, part of the beta field 554 is interpreted as a broadcast field 557B, whose content distinguishes whether or not the broadcast type data manipulation operation is to be performed, while the rest of the beta field 554 is interpreted the vector length field 559B. The memory access 520 instruction templates include the scale field 560, and optionally the displacement field 562A or the displacement scale field 562B.

With regard to the generic vector friendly instruction format 500, a full opcode field 574 is shown including the format field 540, the base operation field 542, and the data element width field 564. While one embodiment is shown where the full opcode field 574 includes all of these fields, the full opcode field 574 includes less than all of these fields in embodiments that do not support all of them. The full opcode field 574 provides the operation code (opcode).

The augmentation operation field 550, the data element width field 564, and the write mask field 570 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIG. 6A is a block diagram illustrating an exemplary specific vector friendly instruction format according to embodiments of the invention. FIG. 6A shows a specific vector friendly instruction format 600 that is specific in the sense that it specifies the location, size, interpretation, and order of the fields, as well as values for some of those fields. The specific vector friendly instruction format 600 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 5 into which the fields from FIG. 6A map are illustrated.

It should be understood that, although embodiments of the invention are described with reference to the specific vector friendly instruction format 600 in the context of the generic vector friendly instruction format 500 for illustrative purposes, the invention is not limited to the specific vector friendly instruction format 600 except where claimed. For example, the generic vector friendly instruction format 500 contemplates a variety of possible sizes for the various fields, while the specific vector friendly instruction format 600 is shown as having fields of specific sizes. By way of specific example, while the data element width field 564 is illustrated as a one bit field in the specific vector friendly instruction format 600, the invention is not so limited (that is, the generic vector friendly instruction format 500 contemplates other sizes of the data element width field 564).

The generic vector friendly instruction format 500 includes the following fields listed below in the order illustrated in FIG. 6A.

EVEX Prefix (Bytes 0-3) 602—is encoded in a four-byte form.

Format Field 540 (EVEX Byte 0, bits [7:0])—the first byte (EVEX Byte 0) is the format field 540 and it contains 0x62 (the unique value used for distinguishing the vector friendly instruction format in one embodiment of the invention).

The second-fourth bytes (EVEX Bytes 1-3) include a number of bit fields providing specific capability.

REX field 605 (EVEX Byte 1, bits [7-5])—consists of a EVEX.R bit field (EVEX Byte 1, bit [7]—R), EVEX.X bit field (EVEX byte 1, bit [6]—X), and 557BEX byte 1, bit[5]—B). The EVEX.R, EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 510—this is the first part of the REX' field 510 and is the EVEX.R' bit field (EVEX Byte 1, bit [4]-R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rar is formed by combining EVEX.R', EVEX.R, and the other RRR from other fields.

Opcode map field 615 (EVEX byte 1, bits [3:0]—mmmm)—its content encodes an implied leading opcode byte (OF, OF 38, or OF 3).

Data element width field 564 (EVEX byte 2, bit [7]—W)—is represented by the notation EVEX.W. EVEX.W is used to define the granularity (size) of the datatype (either 32-bit data elements or 64-bit data elements).

EVEX.vvvv 620 (EVEX Byte 2, bits [6:3]-vvvv)—the role of EVEX.vvvv may include the following: 1) EVEX.vvvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 620 encodes the 4 low-order bits of the first source register specifier stored in inverted (1s complement) form. Depending on the instruction, an extra different EVEX bit field is used to extend the specifier size to 32 registers.

EVEX.0 568 Class field (EVEX byte 2, bit [2]-U)—If EVEX.U=0, it indicates class A or EVEX.U0; if EVEX.U=1, it indicates class B or EVEX.U1.

Prefix encoding field 625 (EVEX byte 2, bits [1:0]-pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 552 (EVEX byte 3, bit [7]—EH; also known as EVEX.EH, EVEX.rs, EVEX.RL, EVEX.write mask control, and EVEX.N; also illustrated with α)—as previously described, this field is context specific.

Beta field 554 (EVEX byte 3, bits [6:4]-SSS, also known as EVEX.$s_{2-0}$, EVEX.$r_{2-0}$, EVEX.rr1, EVEX.LL0, EVEX.LLB; also illustrated with βββ)—as previously described, this field is context specific.

REX' field 510—this is the remainder of the REX' field and is the EVEX.V' bit field (EVEX Byte 3, bit [3]-V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 570 (EVEX byte 3, bits [2:0]-kkk)—its content specifies the index of a register in the write mask registers as previously described. In one embodiment of the invention, the specific value EVEX kkk=000 has a special behavior implying no write mask is used for the particular instruction (this may be implemented in a variety of ways including the use of a write mask hardwired to all ones or hardware that bypasses the masking hardware).

Real Opcode Field 630 (Byte 4) is also known as the opcode byte. Part of the opcode is specified in this field.

MOD R/M Field 640 (Byte 5) includes MOD field 642, Reg field 644, and R/M field 646. As previously described, the MOD field's 642 content distinguishes between memory access and non-memory access operations. The role of Reg field 644 can be summarized to two situations: encoding either the destination register operand or a source register operand, or be treated as an opcode extension and not used to encode any instruction operand. The role of R/M field 646 may include the following: encoding the instruction operand that references a memory address, or encoding either the destination register operand or a source register operand.

Scale, Index, Base (SIB) Byte (Byte 6)—As previously described, the scale field's 550 content is used for memory address generation. SIB.xxx 654 and SIB.bbb 656—the contents of these fields have been previously referred to with regard to the register indexes Xxxx and Bbbb.

Displacement field 562A (Bytes 7-10)—when MOD field 642 contains 10, bytes 7-10 are the displacement field 562A, and it works the same as the legacy 32-bit displacement (disp32) and works at byte granularity.

Displacement factor field 562B (Byte 7)—when MOD field 642 contains 01, byte 7 is the displacement factor field 562B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 562B is a reinterpretation of disp8; when using displacement factor field 562B, the actual displacement is determined by the content of the displacement factor field multiplied by the size of the memory operand access (N). This type of displacement is referred to as disp8\*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 562B substitutes the legacy x86 instruction set 8-bit displacement. Thus, the displacement factor field 562B is encoded the same way as an x86 instruction set 8-bit displacement (so no changes in the ModRM/SIB encoding rules) with the only exception that disp8 is overloaded to disp8\*N. In other words, there are no changes in the encoding rules or encoding lengths but only in the interpretation of the displacement value by hardware (which needs to scale the displacement by the size of the memory operand to obtain a byte-wise address offset).

Immediate field 572 operates as previously described.

Full Opcode Field

FIG. 6B is a block diagram illustrating the fields of the specific vector friendly instruction format 600 that make up the full opcode field 574 according to one embodiment of the invention. Specifically, the full opcode field 574 includes the format field 540, the base operation field 542, and the data element width (W) field 564. The base operation field 542 includes the prefix encoding field 625, the opcode map field 615, and the real opcode field 630.

Register Index Field

FIG. 6C is a block diagram illustrating the fields of the specific vector friendly instruction format 600 that make up the register index field 544 according to one embodiment of the invention. Specifically, the register index field 544 includes the REX field 605, the REX' field 610, the MODR/M.reg field 644, the MODR/M.r/m field 646, the VVVV field 620, xxx field 654, and the bbb field 656.

Augmentation Operation Field

FIG. 6D is a block diagram illustrating the fields of the specific vector friendly instruction format 600 that make up the augmentation operation field 550 according to one embodiment of the invention. When the class (U) field 568 contains 0, it signifies EVEX.U0 (class A 568A); when it contains 1, it signifies EVEX.U1 (class B 568B). When U=0 and the MOD field 642 contains 11 (signifying a no memory access operation), the alpha field 552 (EVEX byte 3, bit [7]—EH) is interpreted as the rs field 552A. When the rs field 552A contains a 1 (round 552A.1), the beta field 554 (EVEX byte 3, bits [6:4]-SSS) is interpreted as the round control field 554A. The round control field 554A includes a one bit SAE field 556 and a two bit round operation field 558. When the rs field 552A contains a 0 (data transform 552A.2), the beta field 554 (EVEX byte 3, bits [6:4]-SSS) is interpreted as a three bit data transform field 554B. When U=0 and the MOD field 642 contains 00, 01, or 10 (signifying a memory access operation), the alpha field 552 (EVEX byte 3, bit [7]—EH) is interpreted as the eviction hint (EH) field 552B and the beta field 554 (EVEX byte 3, bits [6:4]-SSS) is interpreted as a three bit data manipulation field 554C.

When U=1, the alpha field 552 (EVEX byte 3, bit [7]—EH) is interpreted as the write mask control (Z) field 552C. When U=1 and the MOD field 642 contains 11 (signifying a no memory access operation), part of the beta field 554 (EVEX byte 3, bit [4]-S$_0$) is interpreted as the RL field 557A; when it contains a 1 (round 557A.1) the rest of the beta field 554 (EVEX byte 3, bit [6-5]-S$_{2-1}$) is interpreted as the round operation field 559A, while when the RL field 557A contains a 0 (VSIZE 557.A2) the rest of the beta field 554 (EVEX byte 3, bit [6-5]-S$_{2-1}$) is interpreted as the vector length field 559B (EVEX byte 3, bit [6-5]-L$_{1-0}$). When U=1 and the MOD field 642 contains 00, 01, or 10 (signifying a memory access operation), the beta field 554 (EVEX byte 3, bits [6:4]-SSS) is interpreted as the vector length field 559B (EVEX byte 3, bit [6-5]-L$_{1-0}$) and the broadcast field 557B (EVEX byte 3, bit [4]-B).

Exemplary Register Architecture

FIG. 7 is a block diagram of a register architecture 700 according to one embodiment of the invention. In the embodiment illustrated, there are 32 vector registers 710 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 600 operates on these overlaid register file as illustrated in the below tables.

| Adjustable Vector Length | Class | Operations | Registers |
| --- | --- | --- | --- |
| Instruction Templates that do not include the vector length field 559B | A (FIG. 5A; U = 0) | 510, 515, 525, 530 | zmm registers (the vector length is 64 byte) |
| | B (FIG. 5B; U = 1) | 512 | zmm registers (the vector length is 64 byte) |
| Instruction Templates that do include the vector length field 559B | B (FIG. 5B; U = 1) | 517, 527 | zmm, ymm, or xmm registers (the vector length is 64 byte, 32 byte, or 16 byte) depending on the vector length field 559B |

In other words, the vector length field 559B selects between a maximum length and one or more other shorter lengths, where each such shorter length is half the length of the preceding length; and instructions templates without the vector length field 559B operate on the maximum vector length. Further, in one embodiment, the class B instruction templates of the specific vector friendly instruction format 600 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 715—in the embodiment illustrated, there are 8 write mask registers (k0 through k7), each 64 bits in size. In an alternate embodiment, the write mask registers 715 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 725—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 745, on which is aliased the MMX packed integer flat register file 750—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures
In-order and Out-of-Order Core Block Diagram

FIG. 8A is a block diagram illustrating both an exemplary in-order pipeline and an exemplary register renaming, out-of-order issue/execution pipeline according to embodiments of the invention. FIG. 8B is a block diagram illustrating both an exemplary embodiment of an in-order architecture core and an exemplary register renaming, out-of-order issue/execution architecture core to be included in a processor according to embodiments of the invention. The solid lined boxes in FIGS. 8A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 8A, a processor pipeline 800 includes a fetch stage 802, a length decode stage 804, a decode stage 806, an allocation stage 808, a renaming stage 810, a scheduling (also known as a dispatch or issue) stage 812, a register read/memory read stage 814, an execute stage 816, a write back/memory write stage 818, an exception handling stage 822, and a commit stage 824.

FIG. 8B shows processor core 890 including a front end unit 830 coupled to an execution engine unit 850, and both are coupled to a memory unit 870. The core 890 may be a reduced instruction set computing (RISC) core, a complex instruction set computing (CISC) core, a very long instruction word (VLIW) core, or a hybrid or alternative core type. As yet another option, the core 890 may be a special-purpose core, such as, for example, a network or communication core, compression engine, coprocessor core, general purpose computing graphics processing unit (GPGPU) core, graphics core, or the like.

The front end unit 830 includes a branch prediction unit 832 coupled to an instruction cache unit 834, which is coupled to an instruction translation lookaside buffer (TLB) 836, which is coupled to an instruction fetch unit 838, which is coupled to a decode unit 840. The decode unit 840 (or decoder) may decode instructions, and generate as an output one or more micro-operations, micro-code entry points, microinstructions, other instructions, or other control signals, which are decoded from, or which otherwise reflect, or are derived from, the original instructions. The decode unit 840 may be implemented using various different mechanisms. Examples of suitable mechanisms include, but are not limited to, look-up tables, hardware implementations, programmable logic arrays (PLAs), microcode read only memories (ROMs), etc. In one embodiment, the core 890 includes a microcode ROM or other medium that stores microcode for certain macroinstructions (e.g., in decode unit 840 or otherwise within the front end unit 830). The decode unit 840 is coupled to a rename/allocator unit 852 in the execution engine unit 850.

The execution engine unit 850 includes the rename/allocator unit 852 coupled to a retirement unit 854 and a set of one or more scheduler unit(s) 856. The scheduler unit(s) 856 represents any number of different schedulers, including reservations stations, central instruction window, etc. The scheduler unit(s) 856 is coupled to the physical register file(s) unit(s) 858. Each of the physical register file(s) units 858 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 858 comprises a vector registers unit, a write mask registers unit, and a scalar registers unit. These register units may provide architectural vector registers, vector mask registers, and general purpose registers. The physical register file(s) unit(s) 858 is overlapped by the retirement unit 854 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 854 and the physical register file(s) unit(s) 858 are coupled to the execution cluster(s) 860. The execution cluster(s) 860 includes a set of one or more execution units 862 and a set of one or more memory access units 864. The execution units 862 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 856, physical register file(s) unit(s) 858, and execution cluster(s) 860 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 864). It should also be understood that where separate pipelines are used, one or more of these pipelines may be out-of-order issue/execution and the rest in-order.

The set of memory access units 864 is coupled to the memory unit 870, which includes a data TLB unit 872 coupled to a data cache unit 874 coupled to a level 2 (L2) cache unit 876. In one exemplary embodiment, the memory access units 864 may include a load unit, a store address unit, and a store data unit, each of which is coupled to the data TLB unit 872 in the memory unit 870. The instruction cache unit 834 is further coupled to a level 2 (L2) cache unit 876 in the memory unit 870. The L2 cache unit 876 is coupled to one or more other levels of cache and eventually to a main memory.

By way of example, the exemplary register renaming, out-of-order issue/execution core architecture may implement the pipeline 800 as follows: 1) the instruction fetch 838 performs the fetch and length decoding stages 802 and 804; 2) the decode unit 840 performs the decode stage 806; 3) the rename/allocator unit 852 performs the allocation stage 808 and renaming stage 810; 4) the scheduler unit(s) 856 performs the schedule stage 812; 5) the physical register file(s) unit(s) 858 and the memory unit 870 perform the register read/memory read stage 814; the execution cluster 860 perform the execute stage 816; 6) the memory unit 870 and the physical register file(s) unit(s) 858 perform the write back/memory write stage 818; 7) various units may be involved in the exception handling stage 822; and 8) the retirement unit 854 and the physical register file(s) unit(s) 858 perform the commit stage 824.

The core 890 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 890 includes logic to support a packed data instruction set extension (e.g., AVX1, AVX2, and/or some form of the generic vector friendly instruction format (U=0 and/or U=1) previously described), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 834/874 and a shared L2 cache unit 876, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 9B:
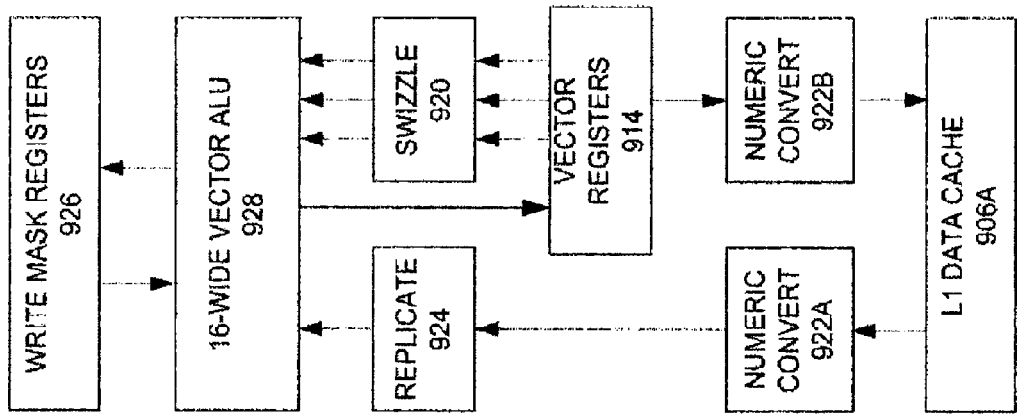
FIG. 9B is an expanded view of part of the processor core in FIG. 9A according to embodiments of the invention.
Figure 9A:
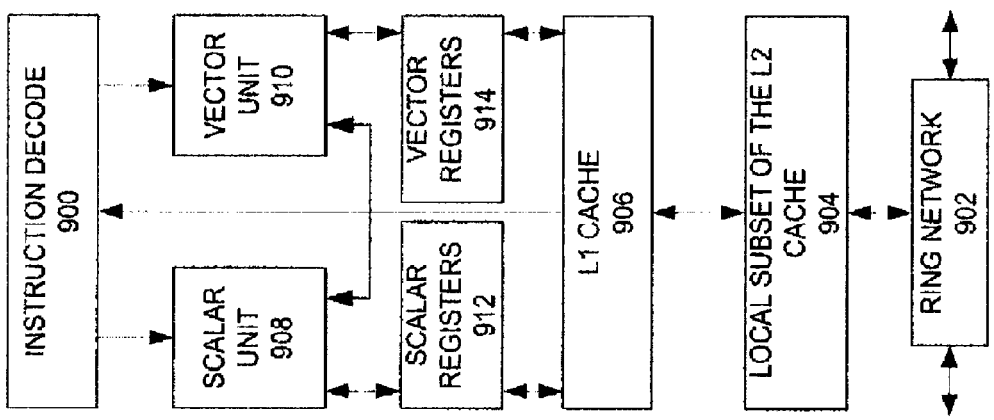
FIG. 9A is a block diagram of a single processor core, along with its connection to the on-die interconnect network and with its local subset of the Level 2 (L2) cache, according to embodiments of the invention.

FIGS. 9A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 9A is a block diagram of a single processor core, along with its connection to the on-die interconnect network 902 and with its local subset of the Level 2 (L2) cache 904, according to embodiments of the invention. In one embodiment, an instruction decoder 900 supports the x86 instruction set with a packed data instruction set extension. An L1 cache 906 allows low-latency accesses to cache memory into the scalar and vector units. While in one embodiment (to simplify the design), a scalar unit 908 and a vector unit 910 use separate register sets (respectively, scalar registers 912 and vector registers 914) and data transferred between them is written to memory and then read back in from a level 1 (L1) cache 906, alternative embodiments of the invention may use a different approach (e.g., use a single register set or include a communication path that allow data to be transferred between the two register files without being written and read back).

The local subset of the L2 cache 904 is part of a global L2 cache that is divided into separate local subsets, one per processor core. Each processor core has a direct access path to its own local subset of the L2 cache 904. Data read by a processor core is stored in its L2 cache subset 904 and can be accessed quickly, in parallel with other processor cores accessing their own local L2 cache subsets. Data written by a processor core is stored in its own L2 cache subset 904 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 9B is an expanded view of part of the processor core in FIG. 9A according to embodiments of the invention. FIG. 9B includes an L1 data cache 906A part of the L1 cache 904, as well as more detail regarding the vector unit 910 and the vector registers 914. Specifically, the vector unit 910 is a 16-wide vector processing unit (VPU) (see the 16-wide ALU 928), which executes one or more of integer, single-precision float, and double-precision float instructions. The VPU supports swizzling the register inputs with swizzle unit 920, numeric conversion with numeric convert units 922A-B, and replication with replication unit 924 on the memory input. Write mask registers 926 allow predicating resulting vector writes.

Processor with Integrated Memory Controller and Graphics

Figure 10:
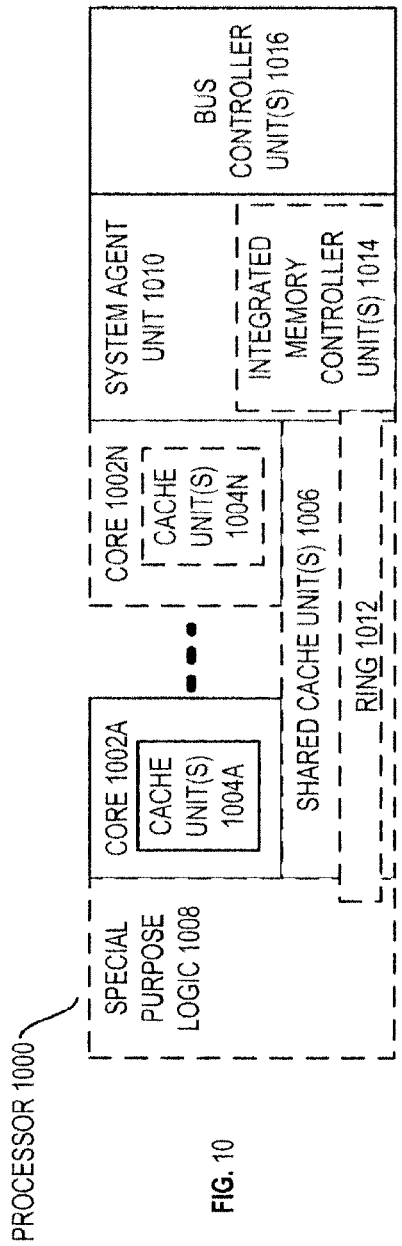
FIG. 10 is a block diagram of a processor that may have more than one core, may have an integrated memory controller, and may have integrated graphics according to embodiments of the invention.

FIG. 10 is a block diagram of a processor 1000 that may have more than one core, may have an integrated memory controller, and may have integrated graphics according to embodiments of the invention. The solid lined boxes in FIG. 10 illustrate a processor 1000 with a single core 1002A, a system agent 1010, a set of one or more bus controller units 1016, while the optional addition of the dashed lined boxes illustrates an alternative processor 1000 with multiple cores 1002A-N, a set of one or more integrated memory controller unit(s) 1014 in the system agent unit 1010, and special purpose logic 1008.

Thus, different implementations of the processor 1000 may include: 1) a CPU with the special purpose logic 1008 being integrated graphics and/or scientific (throughput) logic (which may include one or more cores), and the cores 1002A-N being one or more general purpose cores (e.g., general purpose in-order cores, general purpose out-of-order cores, a combination of the two); 2) a coprocessor with the cores 1002A-N being a large number of special purpose cores intended primarily for graphics and/or scientific (throughput); and 3) a coprocessor with the cores 1002A-N being a large number of general purpose in-order cores. Thus, the processor 1000 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1000 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1006, and external memory (not shown) coupled to the set of integrated memory controller units 1014. The set of shared cache units 1006 may include one or more mid-level caches, such as level 2 (L2), level 3 (L3), level 4 (L4), or other levels of cache, a last level cache (LLC), and/or combinations thereof. While in one embodiment a ring based interconnect unit 1012 interconnects the integrated graphics logic 1008, the set of shared cache units 1006, and the system agent unit 1010/integrated memory controller unit(s) 1014, alternative embodiments may use any number of well-known techniques for interconnecting such units. In one embodiment, coherency is maintained between one or more cache units 1006 and cores 1002-A-N.

In some embodiments, one or more of the cores 1002A-N are capable of multi-threading. The system agent 1010 includes those components coordinating and operating cores 1002A-N. The system agent unit 1010 may include for example a power control unit (PCU) and a display unit. The PCU may be or include logic and components needed for regulating the power state of the cores 1002A-N and the integrated graphics logic 1008. The display unit is for driving one or more externally connected displays.

The cores 1002A-N may be homogenous or heterogeneous in terms of architecture instruction set; that is, two or more of the cores 1002A-N may be capable of execution the same instruction set, while others may be capable of executing only a subset of that instruction set or a different instruction set.

Exemplary Computer Architectures

FIGS. 11-14 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 11:
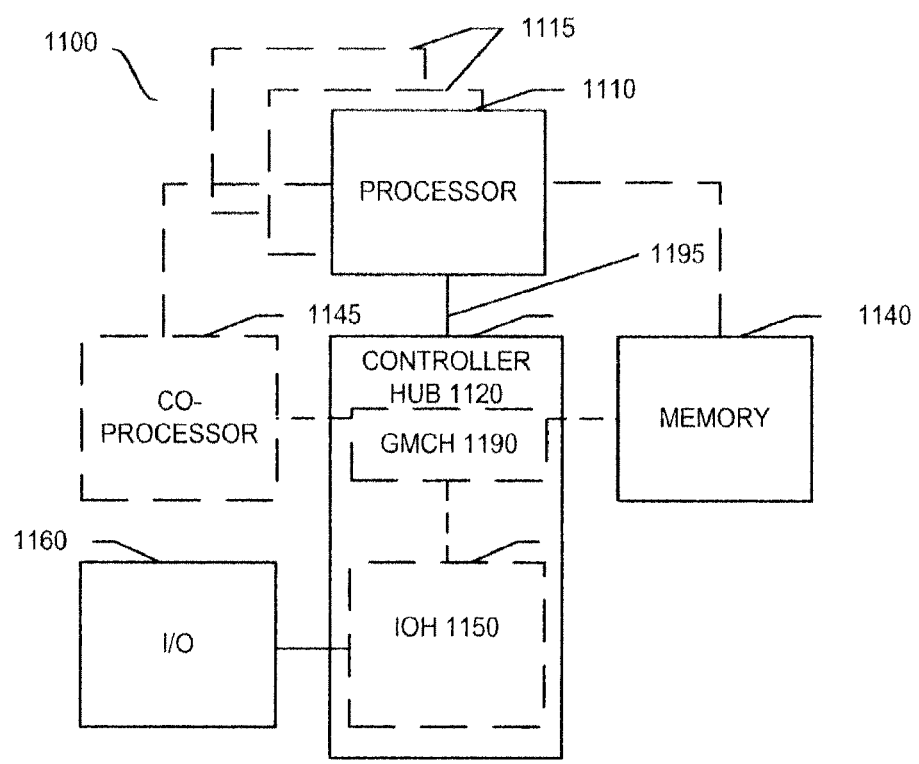
FIG. 11 is a block diagram of a system in accordance with one embodiment of the present invention.

Referring now to FIG. 11, shown is a block diagram of a system 1100 in accordance with one embodiment of the present invention. The system 1100 may include one or more processors 1110, 1115, which are coupled to a controller hub 1120. In one embodiment the controller hub 1120 includes a graphics memory controller hub (GMCH) 1190 and an Input/Output Hub (IOH) 1150 (which may be on separate chips); the GMCH 1190 includes memory and graphics controllers to which are coupled memory 1140 and a coprocessor 1145; the IOH 1150 is couples input/output (I/O) devices 1160 to the GMCH 1190. Alternatively, one or both of the memory and graphics controllers are integrated within the processor (as described herein), the memory 1140 and the coprocessor 1145 are coupled directly to the processor 1110, and the controller hub 1120 in a single chip with the IOH 1150.

The optional nature of additional processors 1115 is denoted in FIG. 11 with broken lines. Each processor 1110, 1115 may include one or more of the processing cores described herein and may be some version of the processor 1000.

The memory 1140 may be, for example, dynamic random access memory (DRAM), phase change memory (PCM), or a combination of the two. For at least one embodiment, the controller hub 1120 communicates with the processor(s) 1110, 1115 via a multi-drop bus, such as a frontside bus (FSB), point-to-point interface such as QuickPath Interconnect (QPI), or similar connection 1195.

In one embodiment, the coprocessor 1145 is a special-purpose processor, such as, for example, a high-throughput MIC processor, a network or communication processor, compression engine, graphics processor, GPGPU, embedded processor, or the like. In one embodiment, controller hub 1120 may include an integrated graphics accelerator.

There can be a variety of differences between the physical resources 1110, 1115 in terms of a spectrum of metrics of merit including architectural, microarchitectural, thermal, power consumption characteristics, and the like.

In one embodiment, the processor 1110 executes instructions that control data processing operations of a general type. Embedded within the instructions may be coprocessor instructions. The processor 1110 recognizes these coprocessor instructions as being of a type that should be executed by the attached coprocessor 1145. Accordingly, the processor 1110 issues these coprocessor instructions (or control signals representing coprocessor instructions) on a coprocessor bus or other interconnect, to coprocessor 1145. Coprocessor(s) 1145 accept and execute the received coprocessor instructions.

Figure 12:
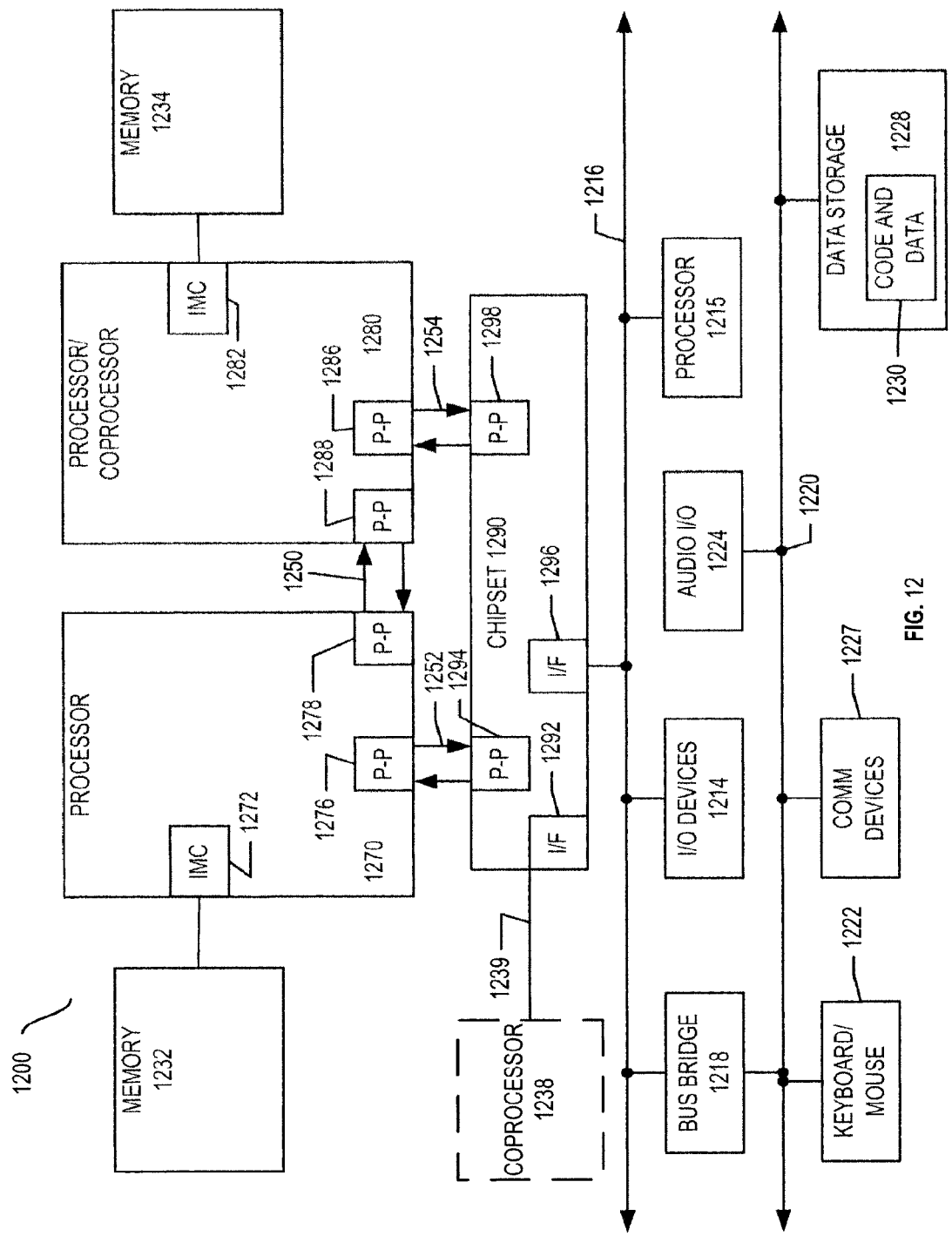
FIG. 12 is a block diagram of a first more specific exemplary system in accordance with an embodiment of the present invention.

Referring now to FIG. 12, shown is a block diagram of a first more specific exemplary system 1200 in accordance with an embodiment of the present invention. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of the processor 1000. In one embodiment of the invention, processors 1270 and 1280 are respectively processors 1110 and 1115, while coprocessor 1238 is coprocessor 1145. In another embodiment, processors 1270 and 1280 are respectively processor 1110 coprocessor 1145.

Processors 1270 and 1280 are shown including integrated memory controller (IMC) units 1272 and 1282, respectively. Processor 1270 also includes as part of its bus controller units point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors.

Processors 1270, 1280 may each exchange information with a chipset 1290 via individual P-P interfaces 1252, 1254 using point to point interface circuits 1276, 1294, 1286, 1298. Chipset 1290 may optionally exchange information with the coprocessor 1238 via a high-performance interface 1239. In one embodiment, the coprocessor 1238 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present invention is not so limited.

As shown in FIG. 12, various I/O devices 1214 may be coupled to first bus 1216, along with a bus bridge 1218 which couples first bus 1216 to a second bus 1220. In one embodiment, one or more additional processor(s) 1215, such as coprocessors, high-throughput MIC processors, GPGPU's, accelerators (such as, e.g., graphics accelerators or digital signal processing (DSP) units), field programmable gate arrays, or any other processor, are coupled to first bus 1216. In one embodiment, second bus 1220 may be a low pin count (LPC) bus. Various devices may be coupled to a second bus 1220 including, for example, a keyboard and/or mouse 1222, communication devices 1227 and a storage unit 1228 such as a disk drive or other mass storage device which may include instructions/code and data 1230, in one embodiment. Further, an audio I/O 1224 may be coupled to the second bus 1220. Note that other architectures are possible. For example, instead of the point-to-point architecture of FIG. 12, a system may implement a multi-drop bus or other such architecture.

Figure 13:
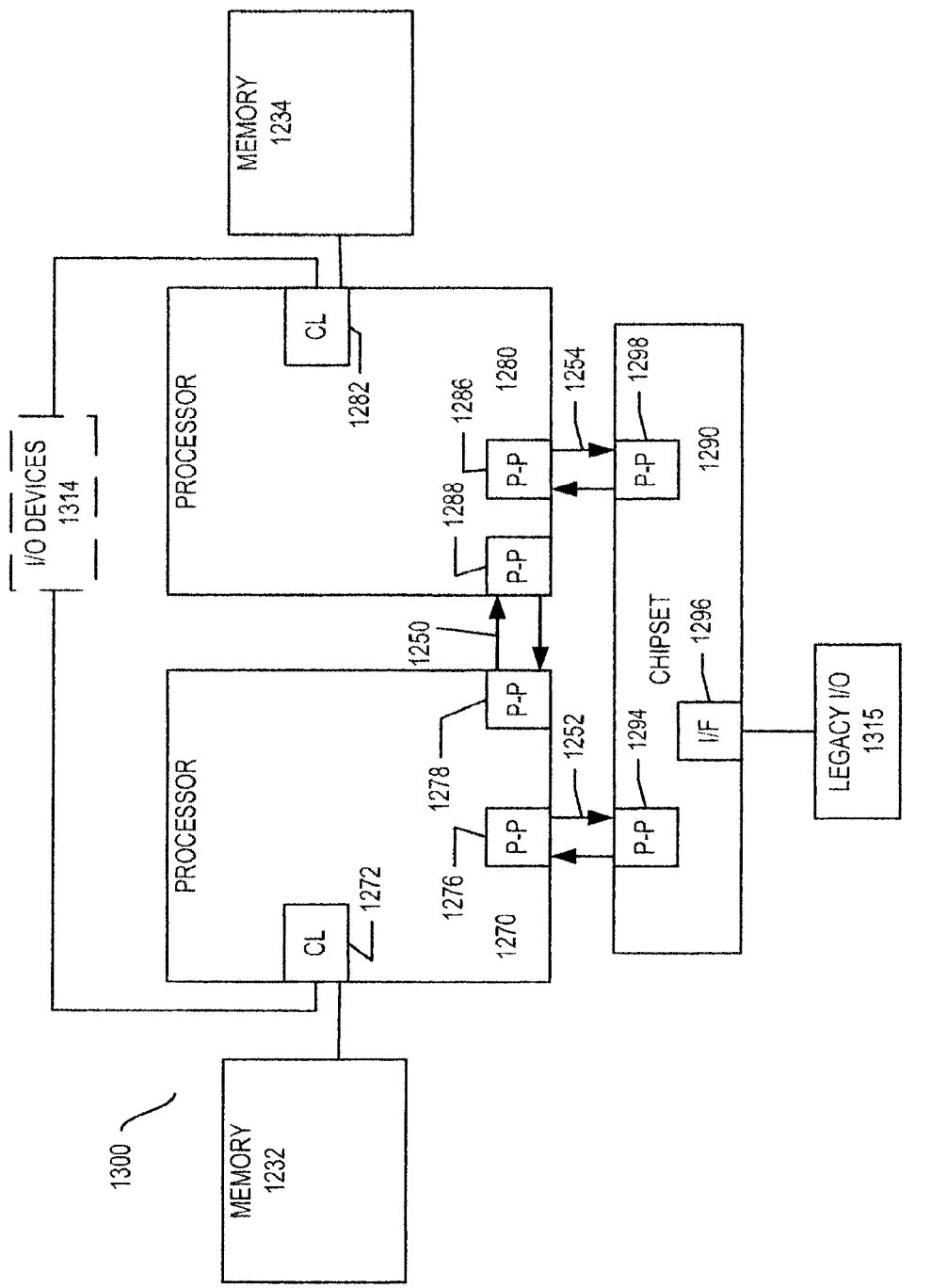
FIG. 13 is a block diagram of a second more specific exemplary system in accordance with an embodiment of the present invention.

Referring now to FIG. 13, shown is a block diagram of a second more specific exemplary system 1300 in accordance with an embodiment of the present invention. Like elements in FIGS. 12 and 13 bear like reference numerals, and certain aspects of FIG. 12 have been omitted from FIG. 13 in order to avoid obscuring other aspects of FIG. 13.

FIG. 13 illustrates that the processors 1270, 1280 may include integrated memory and I/O control logic ("CL") 1272 and 1282, respectively. Thus, the CL 1272, 1282 include integrated memory controller units and include I/O control logic. FIG. 13 illustrates that not only are the memories 1232, 1234 coupled to the CL 1272, 1282, but also that I/O devices 1314 are also coupled to the control logic 1272, 1282. Legacy I/O devices 1315 are coupled to the chipset 1290.

Figure 14:
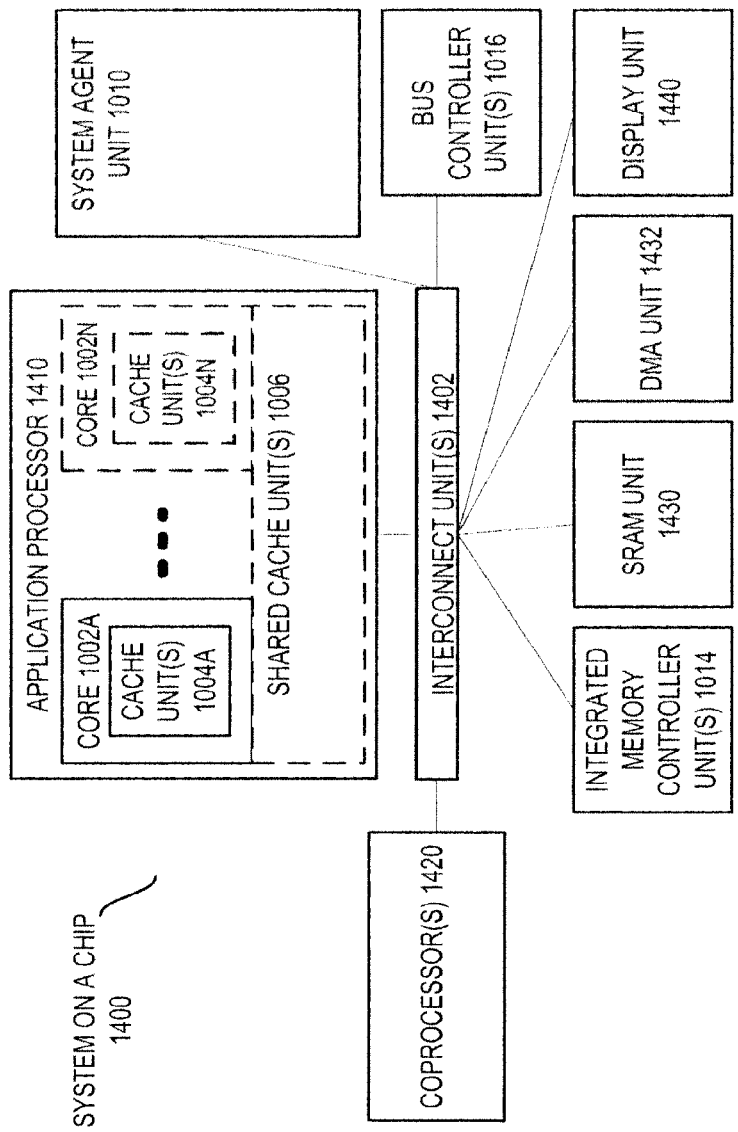
FIG. 14 is a block diagram of a SoC in accordance with an embodiment of the present invention.

Referring now to FIG. 14, shown is a block diagram of a SoC 1400 in accordance with an embodiment of the present invention. Similar elements in FIG. 10 bear like reference numerals. Also, dashed lined boxes are optional features on more advanced SoCs. In FIG. 14, an interconnect unit(s) 1402 is coupled to: an application processor 1410 which includes a set of one or more cores 202A-N and shared cache unit(s) 1006; a system agent unit 1010; a bus controller unit(s) 1016; an integrated memory controller unit(s) 1014; a set or one or more coprocessors 1420 which may include integrated graphics logic, an image processor, an audio processor, and a video processor; an static random access memory (SRAM) unit 1430; a direct memory access (DMA) unit 1432; and a display unit 1440 for coupling to one or more external displays. In one embodiment, the coprocessor(s) 1420 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1230 illustrated in FIG. 12, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 15:
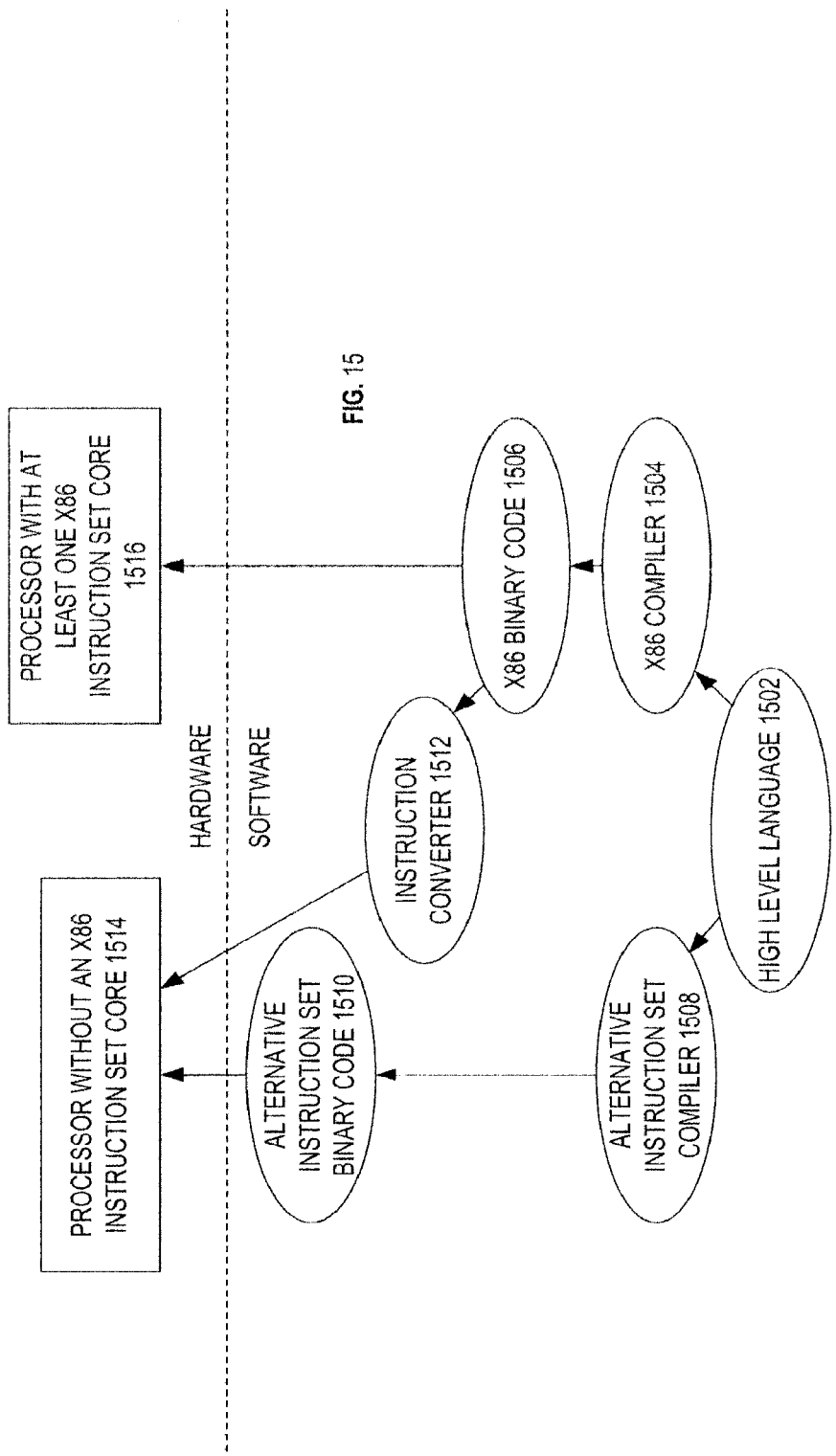
FIG. 15 is a block diagram contrasting the use of a software instruction converter to convert binary instructions in a source instruction set to binary instructions in a target instruction set according to embodiments of the invention.

FIG. 15 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 15 shows a program in a high level language 1502 may be compiled using an x86 compiler 1504 to generate x86 binary code 1506 that may be natively executed by a processor with at least one x86 instruction set core 1516. The processor with at least one x86 instruction set core 1516 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1504 represents a compiler that is operable to generate x86 binary code 1506 (e.g., object code) that can, with or without additional linkage processing, be executed on the processor with at least one x86 instruction set core 1516. Similarly, FIG. 15 shows the program in the high level language 1502 may be compiled using an alternative instruction set compiler 1508 to generate alternative instruction set binary code 1510 that may be natively executed by a processor without at least one x86 instruction set core 1514 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1512 is used to convert the x86 binary code 1506 into code that may be natively executed by the processor without an x86 instruction set core 1514. This converted code is not likely to be the same as the alternative instruction set binary code 1510 because an instruction converter capable of this is difficult to make; however, the converted code will accomplish the general operation and be made up of instructions from the alternative instruction set. Thus, the instruction converter 1512 represents software, firmware, hardware, or a combination thereof that, through emulation, simulation or any other process, allows a processor or other electronic device that does not have an x86 instruction set processor or core to execute the x86 binary code 1506.

Alternative Embodiments

While embodiments of the invention has been described in relation to a instructions for decompressing run length encoded streams where the value zero is run length encoded, other embodiments may use another value to be run length encoded. Therefore, embodiments of the invention are not limited to zero-based encoding. In addition, while embodiments of the invention have been described in relation to specific instructions, alternative embodiments could be implemented such that similar instructions, or multiple instructions, are used to achieve the same function.

For example, while the flow diagrams in the figures show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A processor core, comprising:
a hardware decode unit to decode a plurality of vector instructions, the plurality of vector instructions for decompressing a run length encoded (RLE) set of source data elements, wherein at least one instruction includes a source operand and a destination operand, wherein the source operand specifies a source vector register comprising the set of source data elements; and
an execution engine unit to execute the decoded instructions which causes:
  initialization of a result variable and an insertion point variable;
  generation of a first mask by comparing the set of source data elements to a set of zero elements comprising a same number of elements as the set of source data elements;
  generation of a count of trailing zeros in the first mask;
  generation of a second mask comprising a set of ones based on the count of trailing zeros, wherein the second mask is a bit mask and the set of ones is a number equal to the count of trailing zeros in the first mask;
  a masked copy of the set of source data elements into a temporary buffer using the second mask;
  a number of RLE zeros be read from a first data element in the set of source data elements, the first data element being indexed based on the count of trailing zeros;
  the temporary buffer be shifted to the left based on the insertion point variable;
  a copy of the temporary buffer into the result variable;
  the insertion point variable be updated;
  the set of source data elements be shifted to the right based on the number of trailing zeros;
  determination of whether the set of source data elements contains more valid input;
  in the case the set of source data elements contains more valid input, the method be reiterated beginning at generation of the first mask; and
  in the case the set of source data elements does not contain more valid input, the result variable be output.

2. The processor core of claim 1, wherein the first data element in the set of source data elements is indexed in the set of source elements at a data element located at an index generated by adding one to the count of trailing zeros.

3. The processor core of claim 1, wherein the insertion point is updated to a value determined by adding the insertion point, the count of trailing zeros, and the number of RLE zeros.

4. The processor core of claim 1, wherein the set of source data elements is shifted to the right a number of times indicated by adding two to the count of trailing zeros.

5. The processor core of claim 1, wherein the temporary buffer is shifted to the left a number of times indicated by the value stored in the insertion point.

6. A method for decompressing a run length encoded (RLE) set of source data elements in a computer processor that includes a vector execution unit, the method comprising:

initializing a result variable and an insertion point variable;
generating a first mask by comparing the set of source data elements to a set of zero elements comprising a same number of elements as the set of source data elements;
generating a count of trailing zeros in the first mask;
generating a second mask comprising a set of ones based on the count of trailing zeros, wherein the second mask is a bit mask and the set of ones is a number equal to the count of trailing zeros in the first mask;
performing a masked copy of the set of source data elements into a temporary buffer using the second mask;
reading a number of RLE zeros from a first data element in the set of source data elements, the first data element being indexed based on the count of trailing zeros;
shifting the temporary buffer to the left based on the insertion point variable;
performing a copy of the temporary buffer into the result variable;
updating the insertion point variable;
shifting the set of source data elements to the right based on the number of trailing zeros;
determining whether the set of source data elements contains more valid input;
in the case the set of source data elements contains more valid input, reiterating through the method beginning at generating the first mask; and
in the case the set of source data elements does not contain more valid input, outputting the result variable.

7. The method of claim 6, wherein the first data element in the set of source data elements is indexed in the set of source elements at a data element located at an index generated by adding one to the count of trailing zeros.

8. The method of claim 6, wherein the insertion point is updated to a value determined by adding the insertion point, the count of trailing zeros, and the number of RLE zeros.

9. The method of claim 6, wherein the set of source data elements is shifted to the right a number of times indicated by adding two to the count of trailing zeros.

10. The method of claim 6, wherein the temporary buffer is shifted to the left a number of times indicated by the value stored in the insertion point.

11. An article of manufacture, comprising:
a non-transitory tangible machine-readable storage medium having instructions stored thereon for decompressing a run length encoded (RLE) set of source data elements, wherein at least one instruction includes a source operand and a destination operand, wherein the source operand specifies a source vector register comprising the set of source data elements; and
wherein the instructions include a set of opcodes, which instruct a machine to execute the instructions and cause:
initialization of a result variable and an insertion point variable;
generation of a first mask by comparing the set of source data elements to a set of zero elements comprising a same number of elements as the set of source data elements;
generation of a count of trailing zeros in the first mask;
generation of a second mask comprising a set of ones based on the count of trailing zeros, wherein the second mask is a bit mask and the set of ones is a number equal to the count of trailing zeros in the first mask;
a masked copy of the set of source data elements into a temporary buffer using the second mask;
a number of RLE zeros be read from a first data element in the set of source data elements, the first data element being indexed based on the count of trailing zeros;
the temporary buffer be shifted to the left based on the insertion point variable;
a copy of the temporary buffer into the result variable;
the insertion point variable be updated;
the set of source data elements be shifted to the right based on the number of trailing zeros;
determination of whether the set of source data elements contains more valid input;
in the case the set of source data elements contains more valid input, the method be reiterated beginning at generation of the first mask; and
in the case the set of source data elements does not contain more valid input, the result variable be output.

12. The article of manufacture of claim 11, wherein the first data element in the set of source data elements is indexed in the set of source elements at a data element located at an index generated by adding one to the count of trailing zeros.

13. The article of manufacture of claim 11, wherein the insertion point is updated to a value determined by adding the insertion point, the count of trailing zeros, and the number of RLE zeros.

14. The article of manufacture of claim 11, wherein the set of source data elements is shifted to the right a number of times indicated by adding two to the count of trailing zeros.

15. The article of manufacture of claim 11, wherein the temporary buffer is shifted to the left a number of times indicated by the value stored in the insertion point.

* * * * *